(12) United States Patent
Wu et al.

(10) Patent No.: US 10,770,313 B2
(45) Date of Patent: Sep. 8, 2020

(54) INTEGRATED FAN-OUT PACKAGE AND MANUFACTURING METHOD THEREOF

(71) Applicant: Taiwan Semiconductor Manufacturing Co., Ltd., Hsinchu (TW)

(72) Inventors: Kai-Chiang Wu, Hsinchu (TW); Chung-Hao Tsai, Changhua County (TW); Chun-Lin Lu, Hsinchu (TW); Yen-Ping Wang, Changhua County (TW); Che-Wei Hsu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/389,993

(22) Filed: Apr. 21, 2019

(65) Prior Publication Data

US 2019/0244834 A1 Aug. 8, 2019

Related U.S. Application Data

(62) Division of application No. 15/690,300, filed on Aug. 30, 2017, now Pat. No. 10,276,404.

(51) Int. Cl.
*H01L 21/56* (2006.01)
*H01L 21/768* (2006.01)
(Continued)

(52) U.S. Cl.
CPC .......... *H01L 21/568* (2013.01); *H01L 21/561* (2013.01); *H01L 21/76829* (2013.01);
(Continued)

(58) Field of Classification Search
CPC . H01L 21/568; H01L 24/25; H01L 23/49811; H01L 24/24; H01L 21/561; H01L 21/76829; H01L 23/291; H01L 23/3185; H01L 24/05; H01L 24/32; H01L 21/78; H01L 2224/13155; H01L 2221/68359; H01L 2224/73267; H01L 2224/24227; H01L 2224/13139; H01L 2221/68345; H01L 2224/73253; H01L 2224/18; H01L 2224/25171; H01L 2224/12105; H01L 24/13; H01L 2224/24101; H01L 2224/04105;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Victor A Mandala
(74) *Attorney, Agent, or Firm* — JCIPRNET

(57) ABSTRACT

An integrated fan-out package includes a first redistribution structure, a die, an insulation encapsulation, and a second redistribution structure. The first redistribution structure has a dielectric layer and a feed line disposed on the dielectric layer. The die is disposed on the first redistribution structure. The insulation encapsulation encapsulates the die. The insulation encapsulation has a protrusion laterally wraps around the feed line. The insulation encapsulation has a lower dissipation factor (Df) and/or a lower permittivity (Dk) than the dielectric layer. The second redistribution structure is disposed on the die and the insulation encapsulation.

20 Claims, 23 Drawing Sheets

(51) Int. Cl.
*H01L 23/29* (2006.01)
*H01L 23/31* (2006.01)
*H01L 23/00* (2006.01)
*H01L 21/78* (2006.01)
*H01L 23/498* (2006.01)

(52) U.S. Cl.
CPC ............ *H01L 21/78* (2013.01); *H01L 23/291* (2013.01); *H01L 23/3185* (2013.01); *H01L 23/49811* (2013.01); *H01L 24/05* (2013.01); *H01L 24/24* (2013.01); *H01L 24/25* (2013.01); *H01L 24/32* (2013.01); *H01L 23/3128* (2013.01); *H01L 24/13* (2013.01); *H01L 2221/68345* (2013.01); *H01L 2221/68359* (2013.01); *H01L 2221/68368* (2013.01); *H01L 2224/04105* (2013.01); *H01L 2224/05008* (2013.01); *H01L 2224/05569* (2013.01); *H01L 2224/12105* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/18* (2013.01); *H01L 2224/24101* (2013.01); *H01L 2224/24227* (2013.01); *H01L 2224/25171* (2013.01); *H01L 2224/32225* (2013.01); *H01L 2224/73209* (2013.01); *H01L 2224/73253* (2013.01); *H01L 2224/73267* (2013.01); *H01L 2224/83005* (2013.01)

(58) Field of Classification Search
CPC . H01L 2224/13147; H01L 2224/13113; H01L 2224/13116; H01L 2224/05569; H01L 2224/05008; H01L 2221/68368; H01L 2224/83005; H01L 2224/73209; H01L 2224/32225; H01L 2224/13111; H01L 23/3128; H01L 23/49827; H01L 23/5389; H01L 23/49816; H01L 2224/05572

See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2016/0147088 A1* | 5/2016 | Jou | G02B 6/122 385/2 |
| 2016/0172274 A1* | 6/2016 | Yoon | H01L 23/66 257/664 |
| 2017/0033062 A1* | 2/2017 | Liu | H01L 21/486 |
| 2017/0133351 A1* | 5/2017 | Su | H01L 25/105 |
| 2017/0140202 A1* | 5/2017 | Huang | G06K 9/00053 |
| 2017/0162524 A1* | 6/2017 | Wang | H01L 23/3128 |
| 2018/0034134 A1* | 2/2018 | Dalmia | H01Q 19/30 |
| 2018/0047571 A1* | 2/2018 | Hunt | H01L 24/20 |
| 2018/0131094 A1* | 5/2018 | Ho | H01L 23/5386 |
| 2018/0166405 A1* | 6/2018 | Chiang | H01L 24/82 |
| 2019/0027446 A1* | 1/2019 | Cheng | H01L 21/4853 |
| 2019/0035737 A1* | 1/2019 | Wu | H01L 21/4875 |
| 2019/0067220 A1* | 2/2019 | Wan | H01L 24/24 |
| 2019/0067247 A1* | 2/2019 | Yoo | H01L 21/561 |

* cited by examiner

INTEGRATED FAN-OUT PACKAGE AND MANUFACTURING METHOD THEREOF

CROSS-REFERENCE TO RELATED APPLICATION

This application is a divisional application of and claims the priority benefit of a prior application Ser. No. 15/690,300, filed on Aug. 30, 2017. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
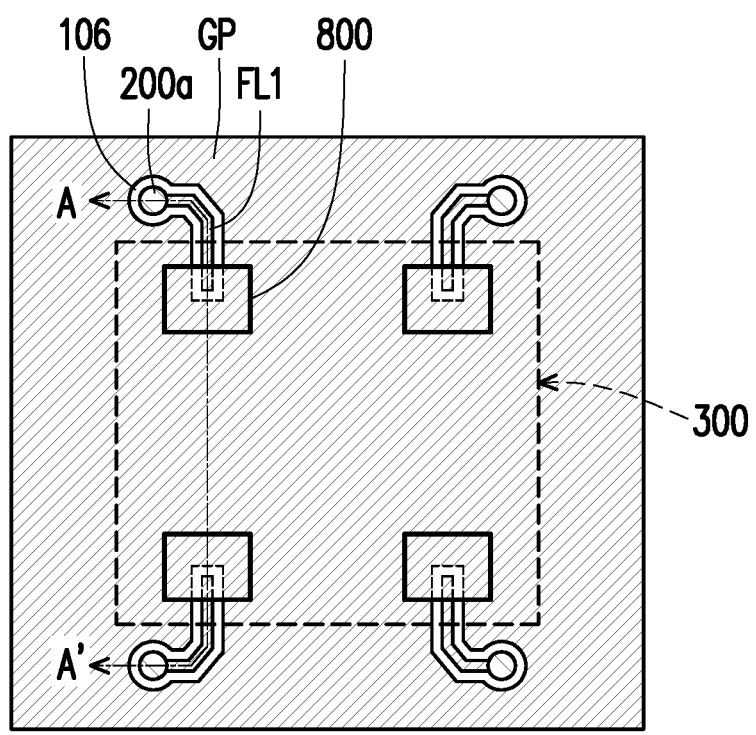
FIG. 1 is a schematic top view illustrating an integrated fan-out package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
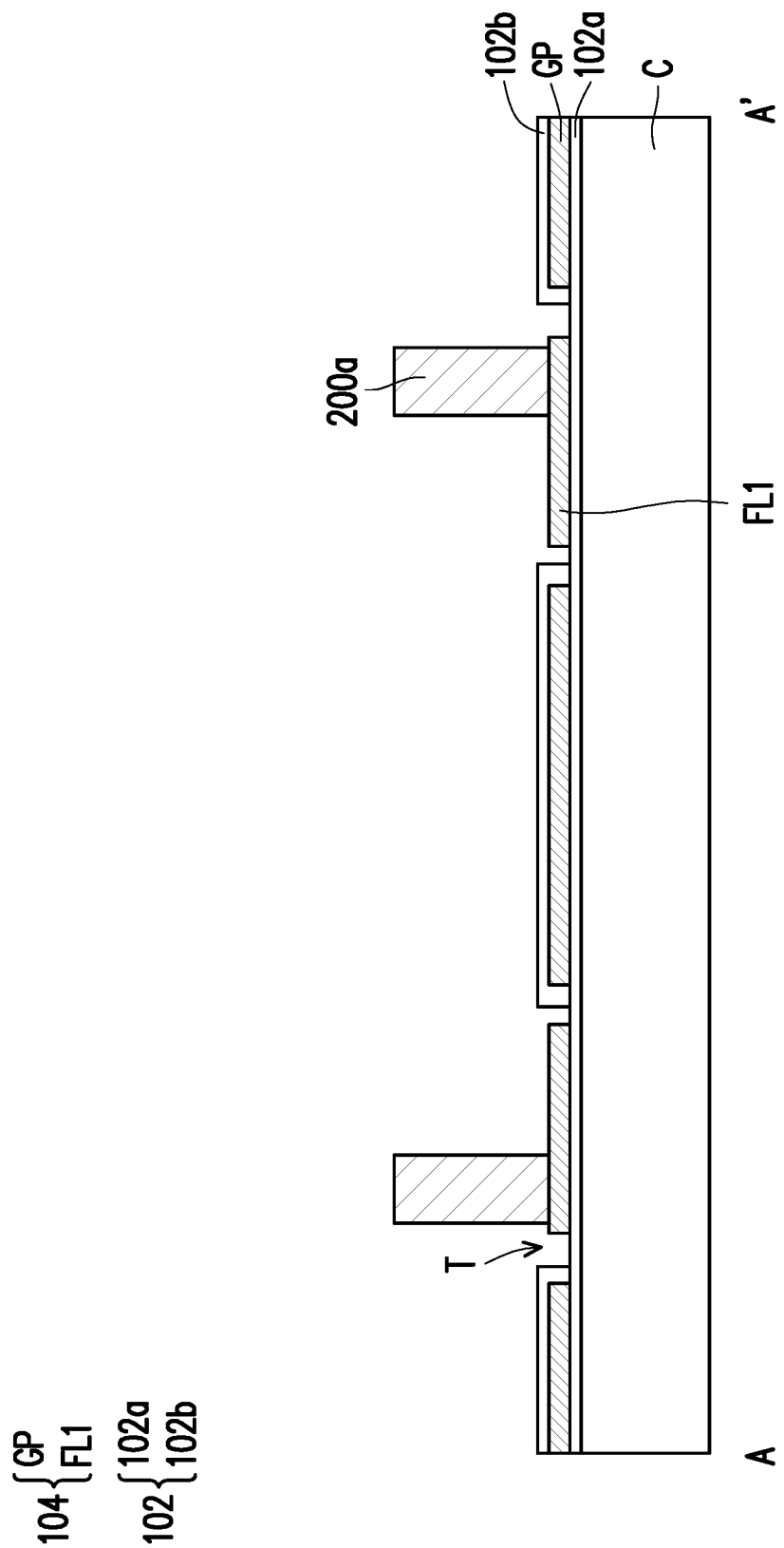
FIG. 2A to FIG. 2J are schematic cross-sectional views illustrating various stages in a manufacturing method of the integrated fan-out package along line A-A' in FIG. 1.

FIG. 1 is a schematic top view illustrating an integrated fan-out package 10 according to some embodiments of the present disclosure. FIG. 2A to FIG. 2J are schematic cross-sectional views illustrating various stages in a manufacturing method of the integrated fan-out package 10 along line A-A' in FIG. 1. Referring to FIG. 1A, a carrier C is provided. In some embodiments, the carrier C is a glass substrate. Subsequently, a dielectric layer 102a, a first conductive pattern layer 104, and a dielectric layer 102b are sequentially formed on the carrier C. In some embodiments, the dielectric layers 102a and 102b are made of the same material, so the dielectric layers 102a and 102b are collectively referred to as a first dielectric layer 102. In some embodiments, the first dielectric layer 102 may be a polymer layer made of polybenzoxazole (PBO), polyimide (PI), benzocyclobutene (BCB), a combination thereof, or the like. The first conductive pattern layer 104 includes a ground plane GP and a plurality of first feed lines FL1. In some embodiments, the ground plane GP may be electrically connected to a ground. On the other hand, the feed lines FL1 may be electrically connected to other subsequently formed conductive elements for signal transmission. The ground plane GP and the first feed lines FL1 may be formed by a same photolithography process at the same time. In some embodiments, the first conductive pattern layer 104 includes copper, nickel, titanium, a combination thereof, or the like. As illustrated in FIG. 2A, in some embodiments, the ground plane GP is substantially embedded in the first dielectric layers 102. On the other hand, the dielectric layer 102b has a plurality of trenches T which expose the first feed lines FL1. In other words, the first feed lines FL1 are disposed on the first dielectric layer 102 (i.e. the dielectric layer 102a) and are not covered by the first dielectric layer 102. In some embodiments, a de-bonding layer (not shown) may be provided between the first dielectric layer 102 and the carrier C. The de-bonding layer may be a light-to-heat conversion (LTHC) release layer and may aid the removal of the carrier C in the subsequent processes. It should be noted that the number of the dielectric layers 102a, 102b and/or the first conductive pattern layer 104 is not limited by the illustration presented in FIG. 2A. In some alternative embodiments, more dielectric layers and/or more conductive pattern layers may be formed to stack alternately.

A plurality of first through interlayer vias (TIV) 200a are formed on the first feed lines FL1 exposed by the trenches T of the dielectric layer 102b. In some embodiments, the method of forming the first TIVs 200a includes the following steps. A seed material layer (not shown) is formed over the first feed lines FL1. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed TIVs. Afterwards, a plating process is performed to form a metal material layer (e.g., a copper layer) on the seed material layer exposed by the openings of the photoresist layer. The photoresist layer and the underlying seed material layer are then removed to form the first TIVs 200a.

Figure 2B:
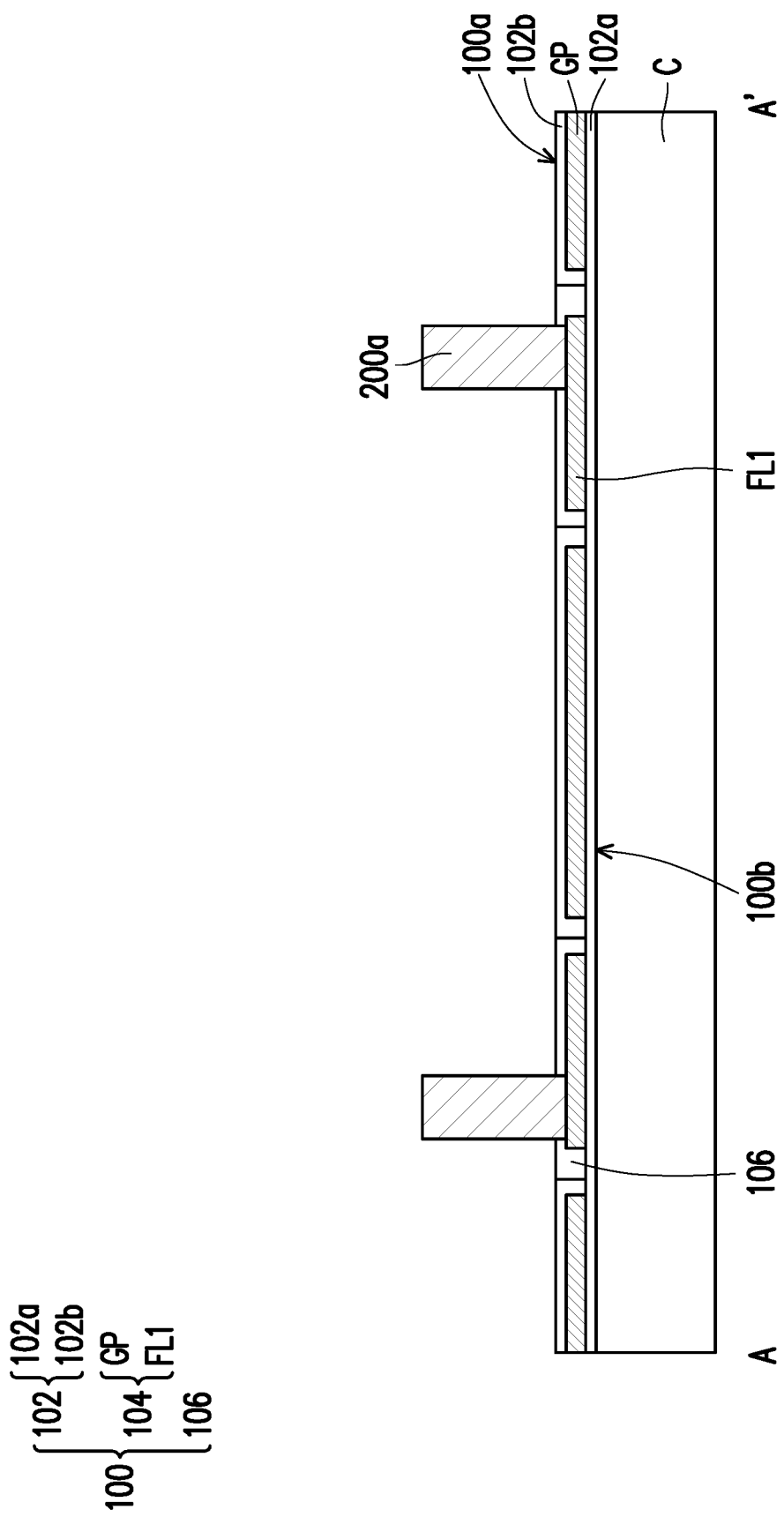

Referring to FIG. 2B, a signal enhancement layer 106 is filled into the trenches T of the dielectric layer 102b to cover the first feed lines FL1. In some embodiments, the signal enhancement layer 106 has a lower dissipation factor (Df) and/or a lower permittivity (Dk) than the first dielectric layer 102. In other words, the signal enhancement layer 106 and the first dielectric layer 102 are formed of different materials. For example, the signal enhancement layer 106 may include epoxy-based, phenolic-based, aromatic-based, or cyanate ester-based molding compounds, FR4 or low temperature co-fired ceramics (LTCC) substrate-based dielectric materials, or pattern-able dielectric materials such as polybenzoxazole (PBO), polyimide (PI), or benzocyclobutene (BCB). In some embodiments, the signal enhancement layer 106 has the Df ranges between 0.001 and 0.02 and the Dk ranges between 3 and 4. In some embodiments, the first dielectric layer 102, the first conductive pattern layer 104, and the signal enhancement layer 106 may be collectively referred to as a first redistribution structure 100. In some embodiments, the first redistribution structure 100 may be referred to as a backside redistribution structure. The first redistribution structure 100 has a first surface 100a and a second surface 100b opposite to the first surface 100a. At this stage, the first surface 100a faces upward while the second surface 100b is attached to the carrier C.

Figure 2C:
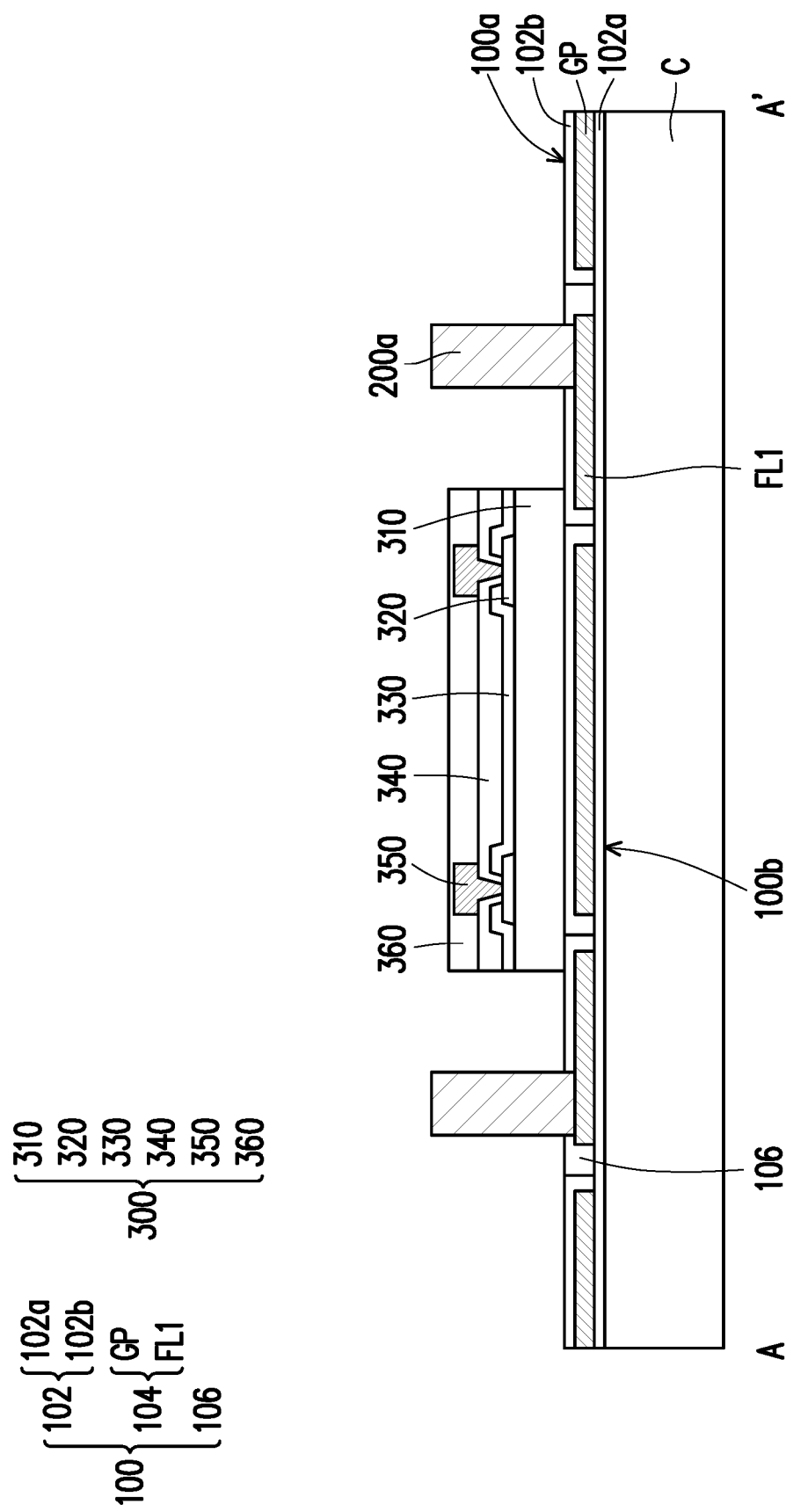

Referring to FIG. 2C, a die 300 (or integrated circuit components) may be picked and placed on the first surface 100a of the first redistribution structure 100. The die 300, for example, includes a semiconductor substrate 310, a plurality of conductive pads 320, a passivation layer 330, a post passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a polyimide (PI) layer, a polybenzoxazole (PBO) layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 so as to cover the conductive vias 350.

In some embodiments, the die 300 is attached (or adhered) on the first dielectric layer 102 and the signal enhancement layer 106 through a die attach film (not shown). In some embodiments, one or more die(s) 300 may be picked and placed on the first dielectric layer 102 and the signal enhancement layer 106 after the formation of the first TIVs 200a. However, the disclosure is not limited thereto. In some alternative embodiments, one or more die(s) 300 may be picked and placed on the first dielectric layer 102 and the signal enhancement layer 106 before the formation of the first TIVs 200a.

Figure 2D:
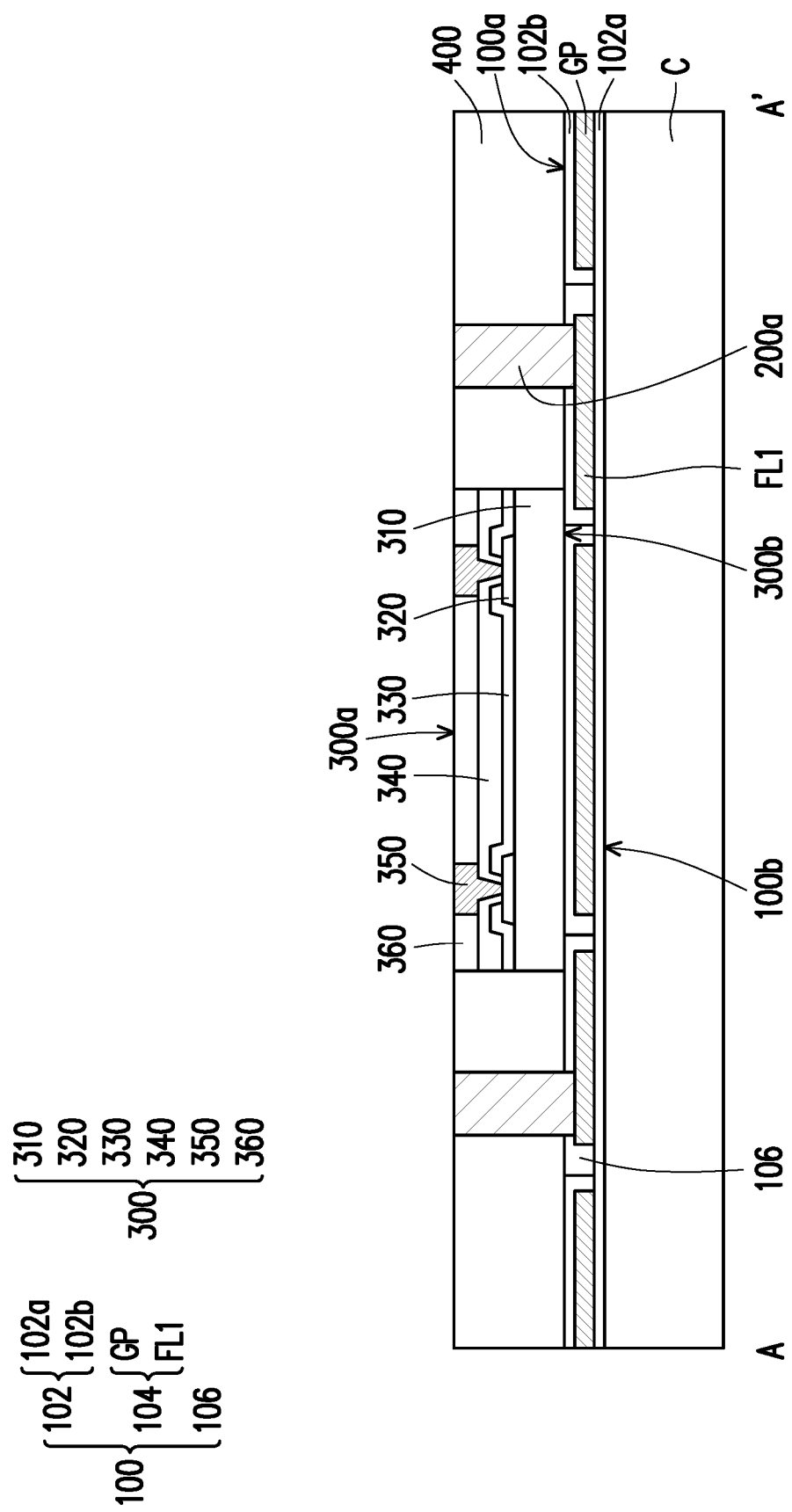

Referring to FIG. 2D, an insulation encapsulation 400 is formed over the first surface 100a of the first redistribution structure 100 to encapsulate the die 300 and the first TIVs 200a. In some embodiments, the insulation encapsulation 400 includes a molding compound, a molding underfill, a resin or the like, such as epoxy. In some alternative embodiments, the insulation encapsulation 400 includes a photo-sensitive material such as polybenzoxazole (PBO), polyimide, benzocyclobutene (BCB), a combination thereof, or the like. In some embodiments, the method of forming the insulation encapsulation 400 includes the following steps. First, an insulating material (not shown) is formed on the first dielectric layer 102 and the signal enhancement layer 106 through, for example, a compression molding process so as to encapsulate the die 300 and the first TIVs 200a. The conductive vias 350 and the protection layer 360 of the die 300 are encapsulated by the insulating material. In other words, the conductive vias 350 and the protection layer 360 of the die 300 are not revealed and are well protected by the insulating material. Thereafter, the insulating material is grinded until the top surfaces of the conductive pillars 350, the top surfaces of the first TIVs 200a, and the top surface of the protection layer 360 are exposed, so as to form the insulation encapsulation 400. In some embodiments, the insulating material is grinded by a mechanical grinding process and/or a chemical mechanical polishing (CMP) process. In some embodiments, during the grinding process of the insulating material, the protection layer 360 is grinded to reveal the conductive vias 350. In some embodiments, portions of the first TIVs 200a and portions of the conductive vias 350 are slightly grinded also. After grinding, the die 300 has an active surface 300a and a rear surface 300b opposite to the active surface 300a. The exposed portion of the conductive vias 350 is located on the active surface 300a of the die 300. In some embodiments, the first feed lines FL1 extend over the rear surface 300b of the die 300.

Figure 2E:
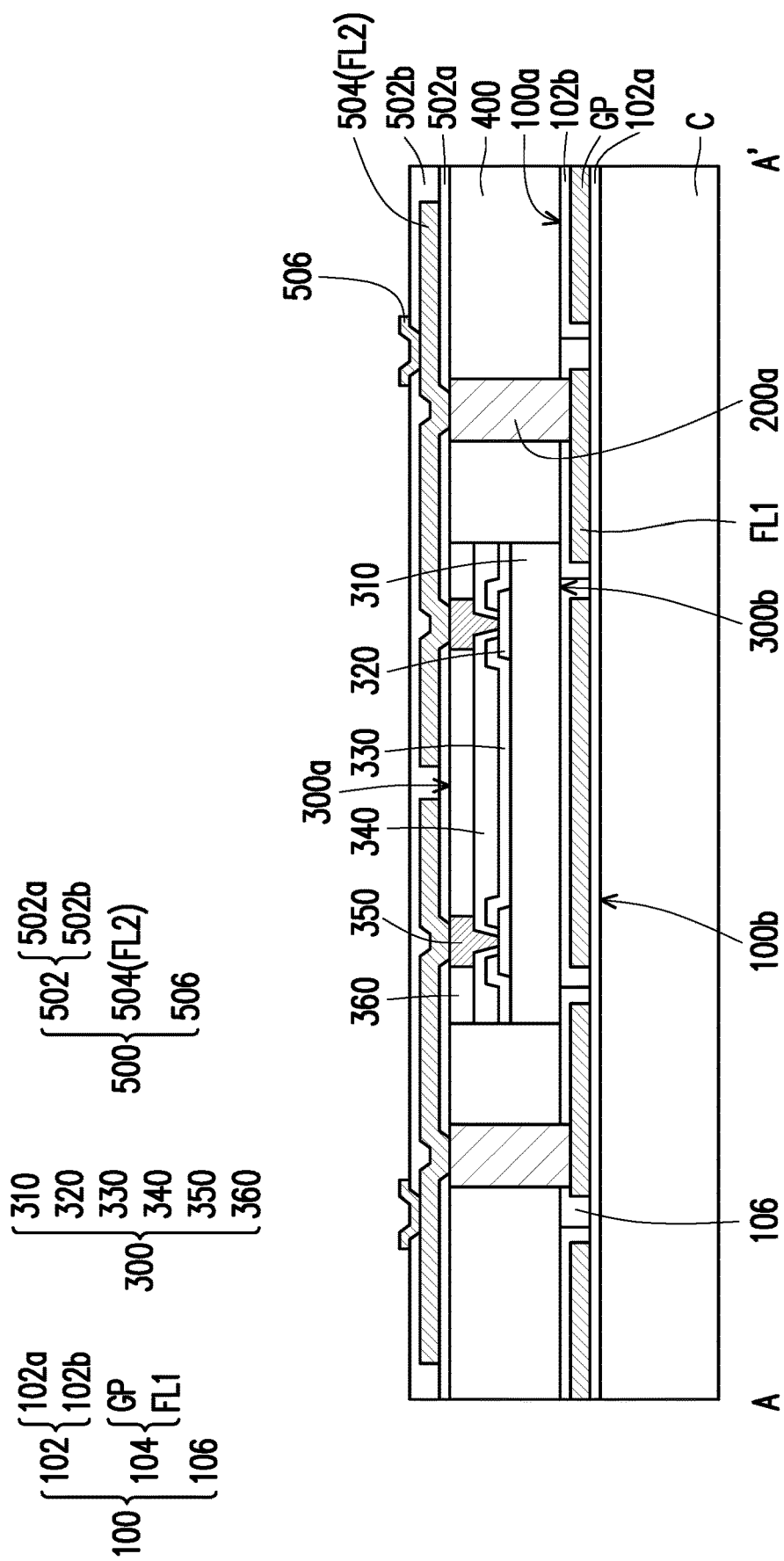

Referring to FIG. 2E, a second redistribution structure 500 is formed on the die 300 and the insulation encapsulation 400. As illustrated in FIG. 2E, the active surface 300a of the die 300 faces the second redistribution structure 500. In some embodiments, the second redistribution structure 500 includes a second dielectric layer 502, a second conductive pattern layer 504, and an under-ball metallurgy (UBM) layer 506. In some embodiments, the second dielectric layer 502 may be constituted by dielectric layers 502a, 502b made of a same material. In some embodiments, the second dielectric layer 502 may include the same material as that of the first dielectric layer 102. For example, the second dielectric layer 502 may be a polymer layer made of polybenzoxazole (PBO), polyimide (PI), benzocyclobutene (BCB), a combination thereof, or the like. Similarly, the second conductive pattern layer 504 and the UBM layer 506 may include the same material as that of the first conductive pattern layer 104. For example, the second conductive pattern layer 504 and the UBM layer 506 may include copper, nickel, titanium, a combination thereof, or the like. The second conductive pattern layer 504 is electrically connected to the conductive vias 350 of the die 300 and the first TIVs 200a embedded in the insulating encapsulation 400. In other words, the first TIVs 200a electrically connect the first redistribution structure 100 and the second redistribution structure 500. In some embodiments, the topmost second conductive pattern layer 504 may be referred to as the UBM layer 506 for ball mount. In some embodiments, when the second conductive pattern layer 504 is adapted to transmit signal from the die 300 to the first feed line FL1 through the first TIVs 200a, the second conductive pattern layer 504 may be referred to as a second feed line FL2. As illustrated in FIG. 2E, the dielectric layer 502a, the first conductive pattern layer 504, the dielectric layer 502b, and the UBM layer 506 are stacked in sequential order. However, this configuration construes no limitation in the present disclosure. In some alternative embodiments, more dielectric layers and/or more conductive patterns layers may be formed to stack alternately. In some embodiments, the second redistribution structure 500 may be referred to as a front-side redistribution structure.

Figure 2F:
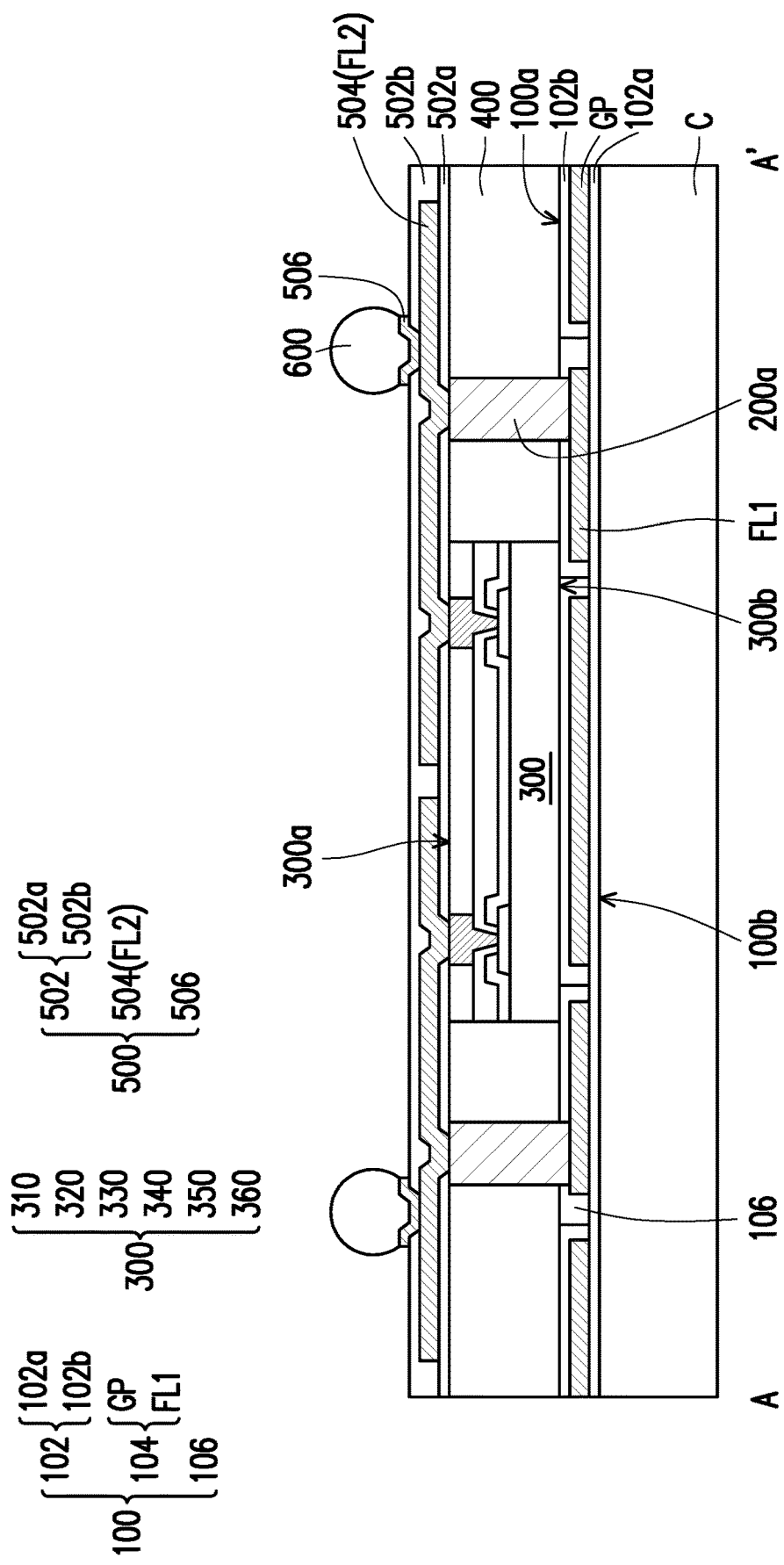

Referring to FIG. 2F, a plurality of conductive terminals 600 are formed on the second redistribution structure 500. In some embodiments, the conductive terminals 600 are attached to the UBM layer 506 through a solder flux (not shown). In some embodiments, the conductive terminals 600 are, for example, solder balls, ball grid array (BGA) balls, or C4 bumps. In some embodiments, the conductive terminals 600 are made of a conductive material with low resistivity, such as Sn, Pb, Ag, Cu, Ni, Bi, or an alloy thereof. In some embodiments, the conductive terminals 600 may be disposed on the UBM layer 506 by a ball placement process and/or a reflow process.

Figure 2G:
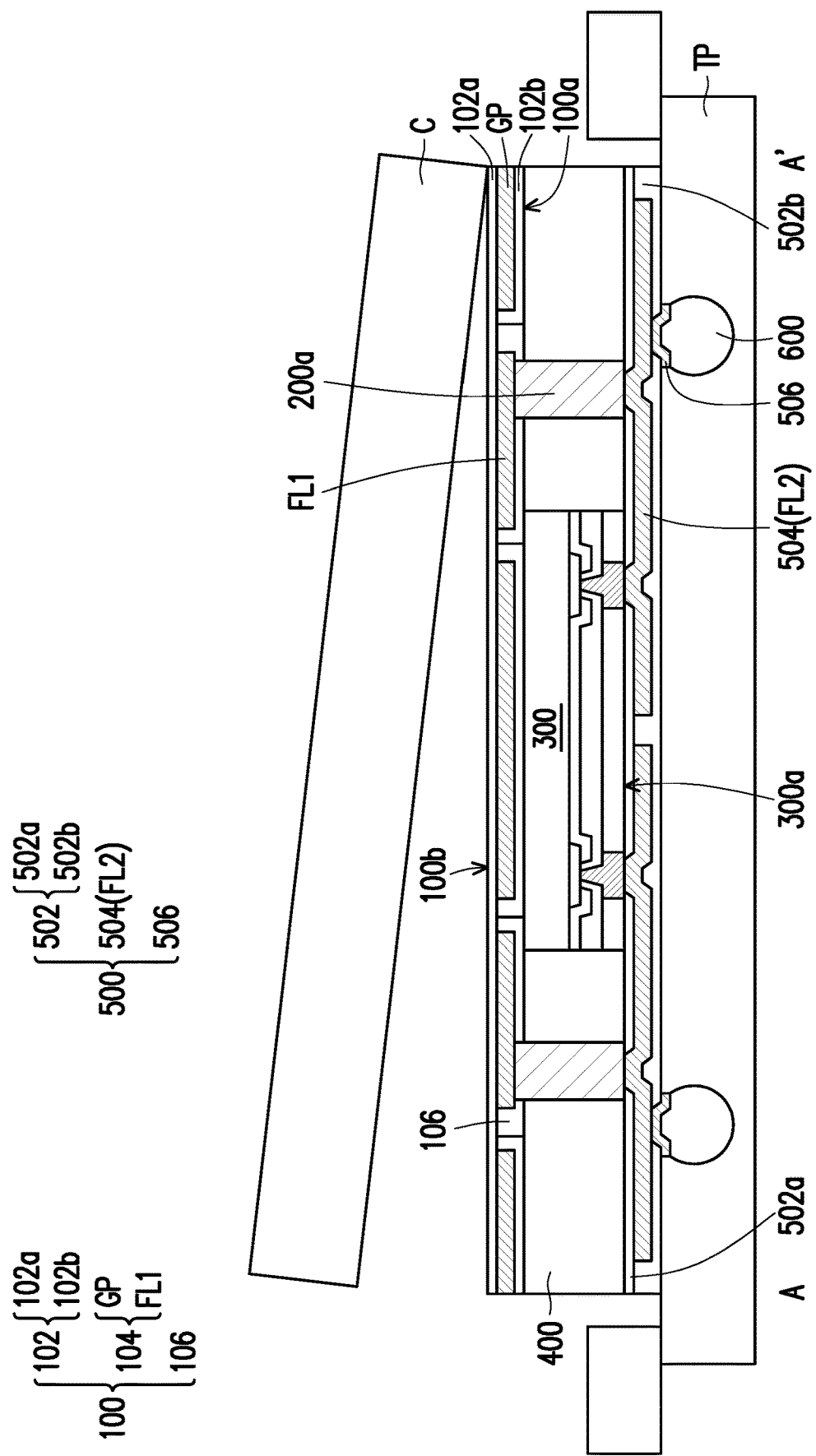

Referring to FIG. 2G, after the conductive terminals 600 are formed, the structure illustrated in FIG. 2F is flipped upside down and is attached to a tape TP for further processing. As illustrated in FIG. 2G, the carrier C is separated from the second surface 100b of the first redistribution structure 100. In some embodiments, the de-bonding layer (not illustrated; e.g. LTHC release layer) may be irradiated by UV laser such that the dielectric layer 102 is de-bonded from the carrier C.

Figure 2H:
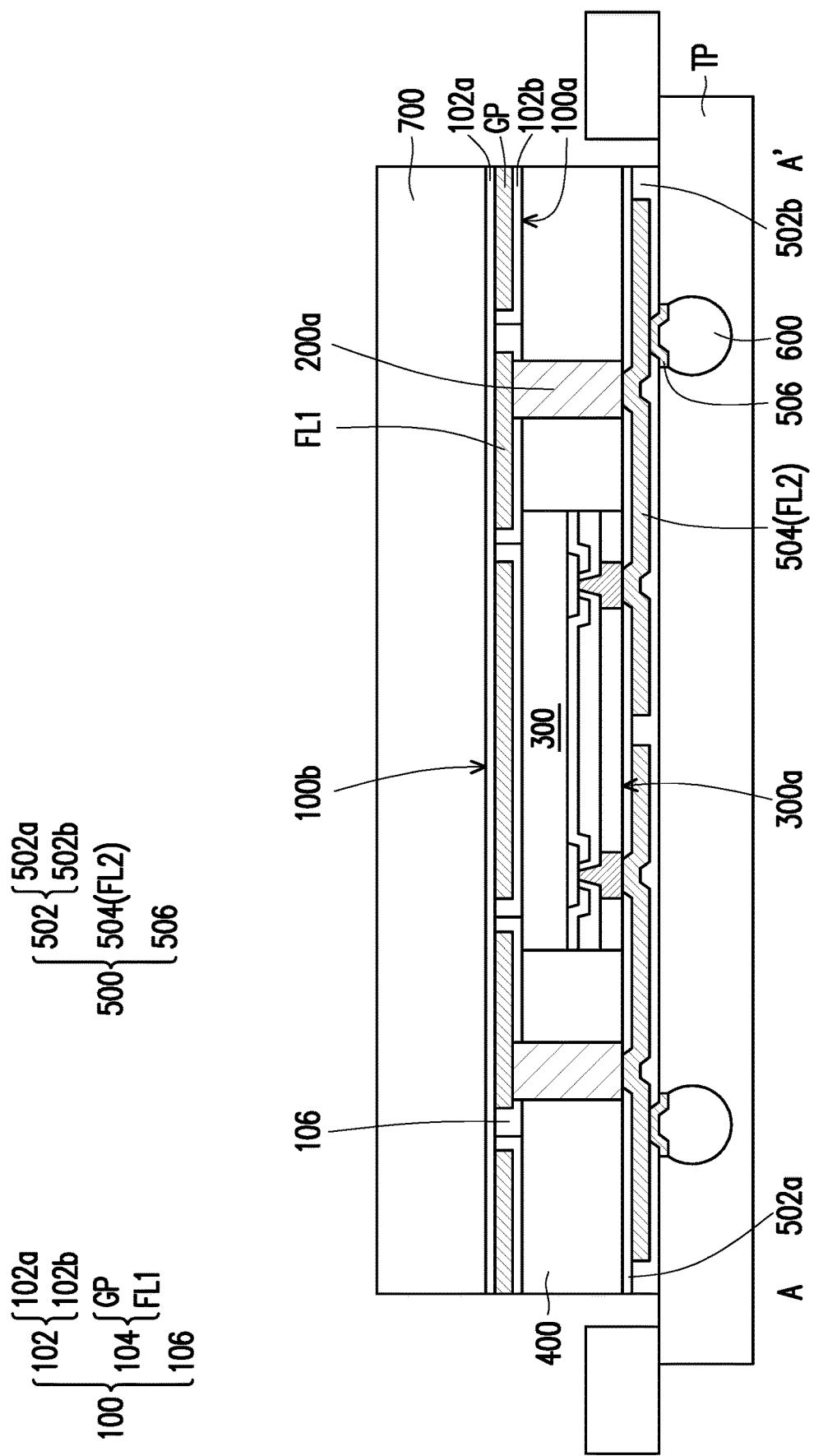

Referring to FIG. 2H, an insulating layer 700 is formed over the second surface 100b of the first redistribution structure 100. In some embodiments, the insulating layer 700 is formed on the dielectric layer 102a. In some embodiments, the insulating layer 700 is a polymer layer. For example, the insulating layer 700 includes a photo-sensitive material such as polybenzoxazole (PBO), polyimide, benzocyclobutene (BCB), a combination thereof, or the like. In some alternative embodiments, the insulating layer 700 includes epoxy resins or any other suitable type of molding materials. In some embodiments, the material of the insulating layer 700 has low Dk and low Df properties. Depending on the frequency range of high-speed applications, suitable materials of the insulating layer 700 may be selected based on the required electrical properties of the integrated fan-out package 10. The insulating layer 700 is formed by a suitable fabrication technique such as spin-coating, lamination, deposition or the like.

Figure 2I:
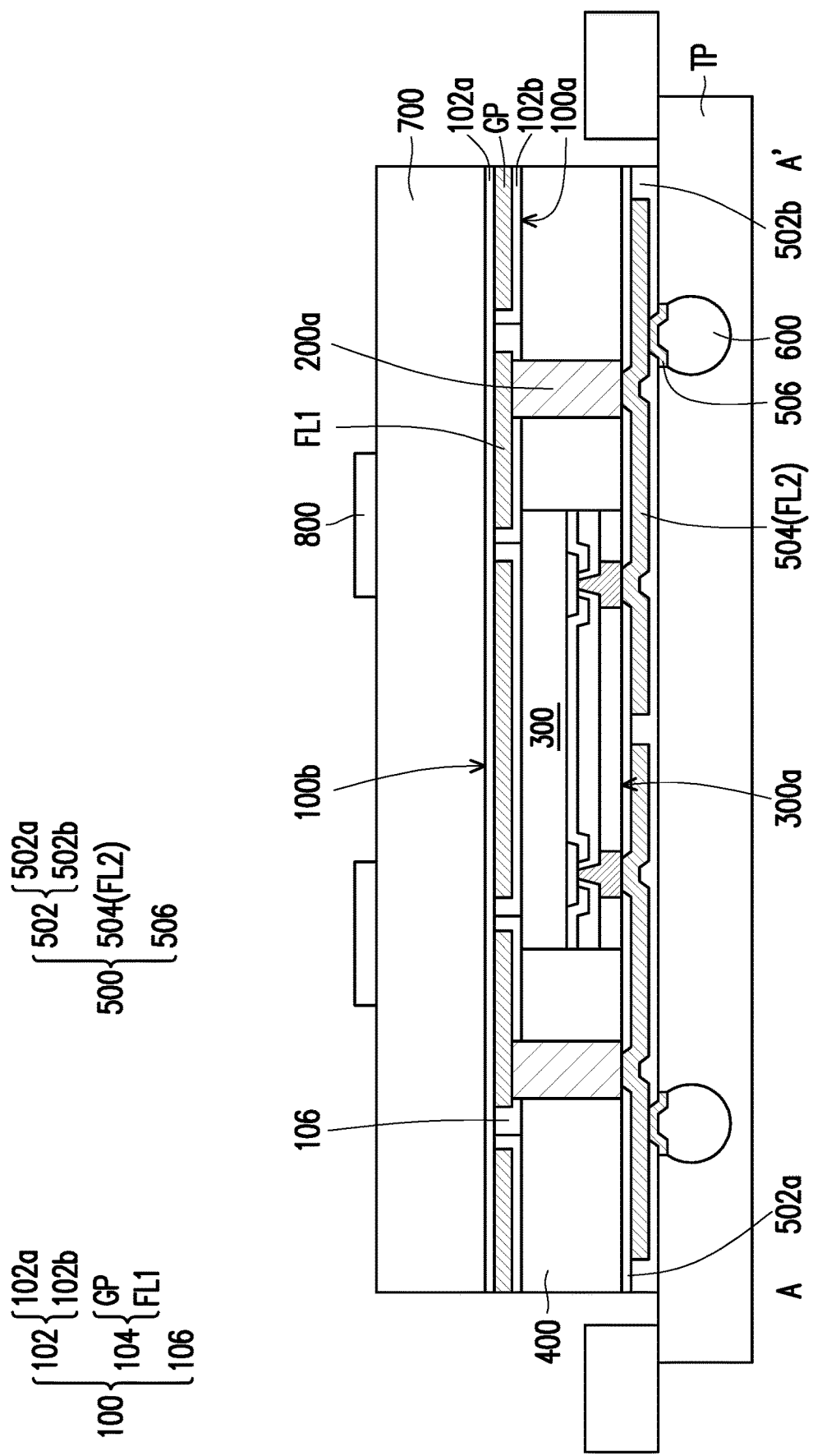

Referring to FIG. 2I, a plurality of conductive patches 800 are formed on the insulating layer 700. In some embodiments, the conductive patches 800 may be electrically coupled to the first feed lines FL1 of the first redistribution structure 100. In other words, the signal transmitted in the first feed lines FL1 may be electrically coupled to the conductive patches 800 such that the conductive patches 800 may be referred to as patch antennas. In some embodiments, the conductive patches 800 are formed by forming a metallization layer (not shown) through electroplating or deposition over the insulating layer 700 and then patterning the metallization layer by photolithography and etching processes. In some alternative embodiments, the conductive patches 800 may be formed by forming a plurality of metallization patterns (not shown) directly through plating processes. In some embodiments, the material of the conductive patches 800 includes aluminum, titanium, copper, nickel, tungsten, and/or alloys thereof.

Figure 2J:
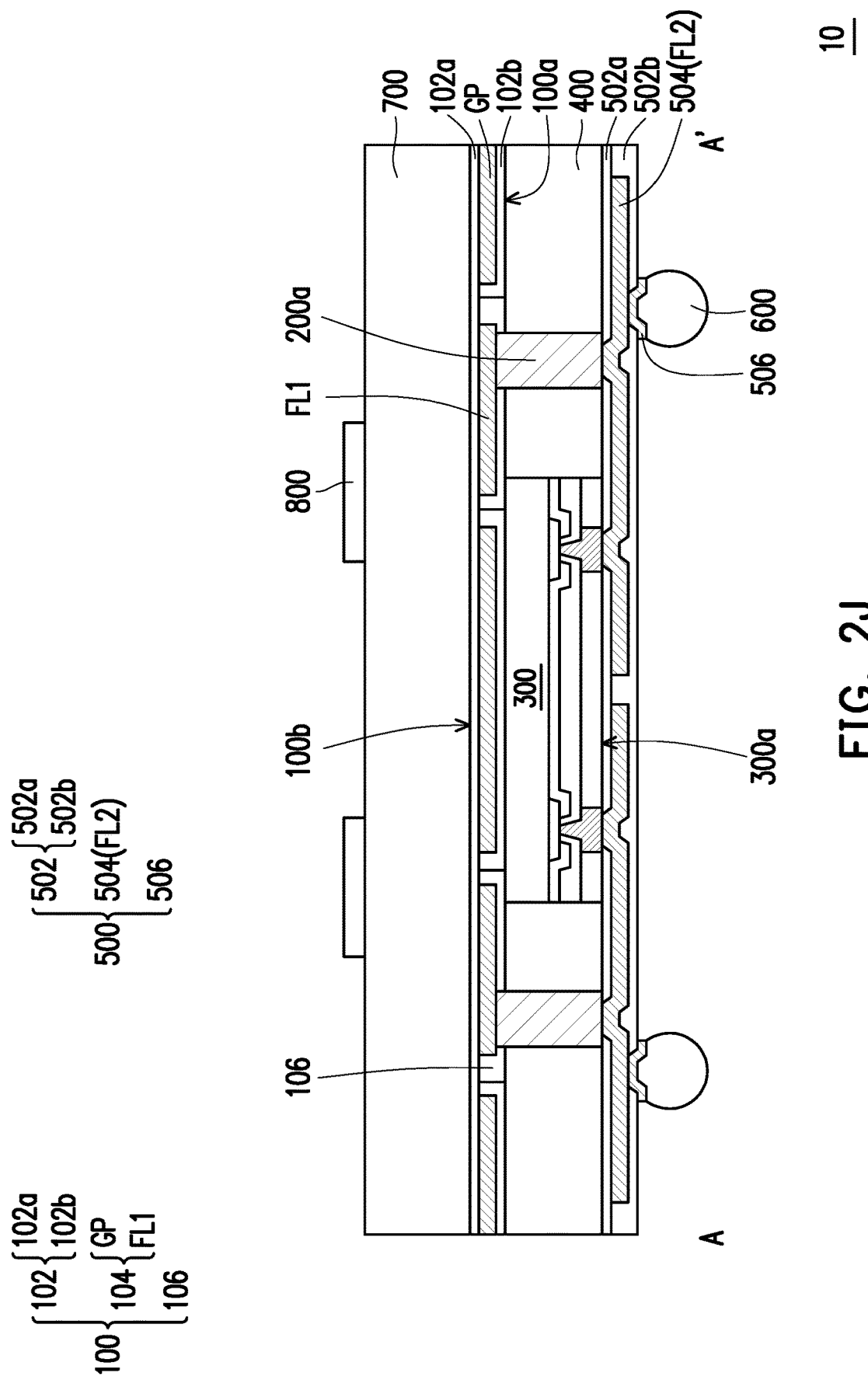

Referring to FIG. 1 and FIG. 2J, the structure illustrated in FIG. 2I is separated from the tape TP to obtain the integrated fan-out package 10. It should be noted that for simplicity, certain elements in the integrated fan-out package 10 is omitted in FIG. 1. As illustrated in FIG. 1 and FIG. 2J, since the first feed lines FL1 are wrapped around by the signal enhancement layer 106, due to the low dissipation factor and/or the low permittivity nature of the signal enhancement layer 106, the signal loss/decay when transmitting through the first feed lines FL1 may be effectively reduced. As a result, the signal originated from the die 300 may be coupled to the conductive patches 800 with minimum loss, thereby effectively enhancing the efficiency of the integrated fan-out package 10.

Figure 3:
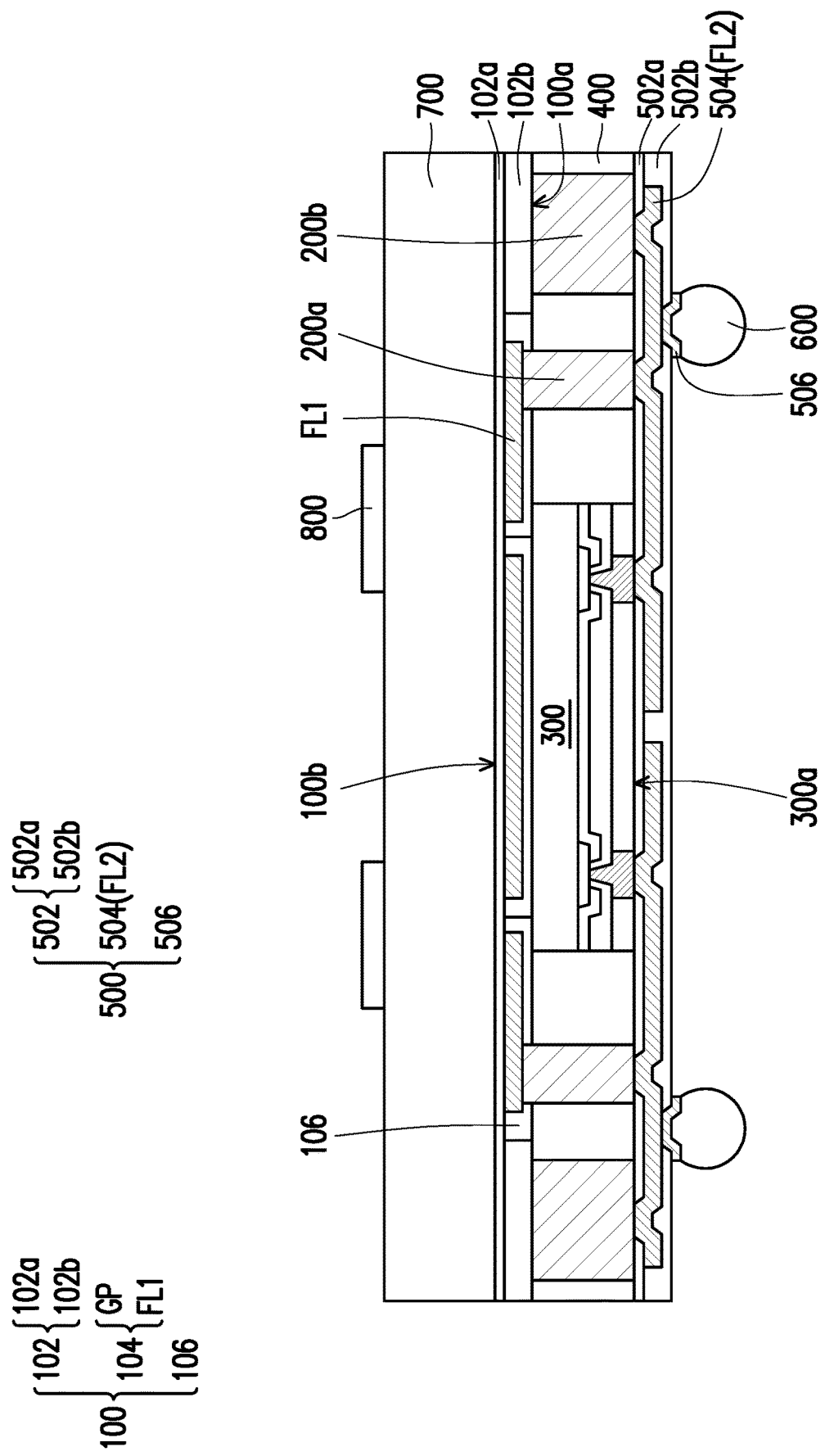
FIG. 3 is a schematic cross-sectional view illustrating an integrated fan-out package according to some alternative embodiments of the present disclosure.

FIG. 3 is a schematic cross-sectional view illustrating an integrated fan-out package 20 according to some alternative embodiments of the present disclosure. The integrated fan-out package 20 of FIG. 3 may be manufactured by the steps similar to the steps illustrated in FIG. 2A to FIG. 2J, so similar elements are denoted by the same reference numeral and the detailed descriptions thereof are omitted herein. As illustrated in FIG. 3, the integrated fan-out package 20 further includes a plurality of second TIVs 200b embedded in the insulation encapsulation 400. The second TIVs 200b are electrically connected to the second redistribution structure 500. In some embodiments, the second TIVs 200b may be formed on the dielectric layer 102b during the step of forming the first TIVs 200a (the step illustrated in FIG. 2A). For example, the first TIVs 200a and the second TIVs 200b may be simultaneously formed. In some embodiments, the second TIVs 200b are arranged to form a plurality of dipole antennas. In some embodiments, the second TIVs 200b (dipole antennas) have a dimension (e.g. width) greater than that of the first TIVs 200a. However, the present disclosure is not limited thereto. In some alternative embodiments, the second TIVs 200b (dipole antennas) may have a dimension (e.g. width) substantially equal to or less than that of the first TIVs 200a. As illustrated in FIG. 2, since the first feed lines FL1 are wrapped around by the signal enhancement layer 106, due to the low loss dissipation factor and/or the low permittivity nature of the signal enhancement layer 106, the signal loss/decay when transmitting through the first feed lines FL1 may be effectively reduced. As a result, the signal originated from the die 300 may be coupled to the conductive patches 800 with minimum loss, thereby effectively enhancing the efficiency of the integrated fan-out package 20.

Figure 4:
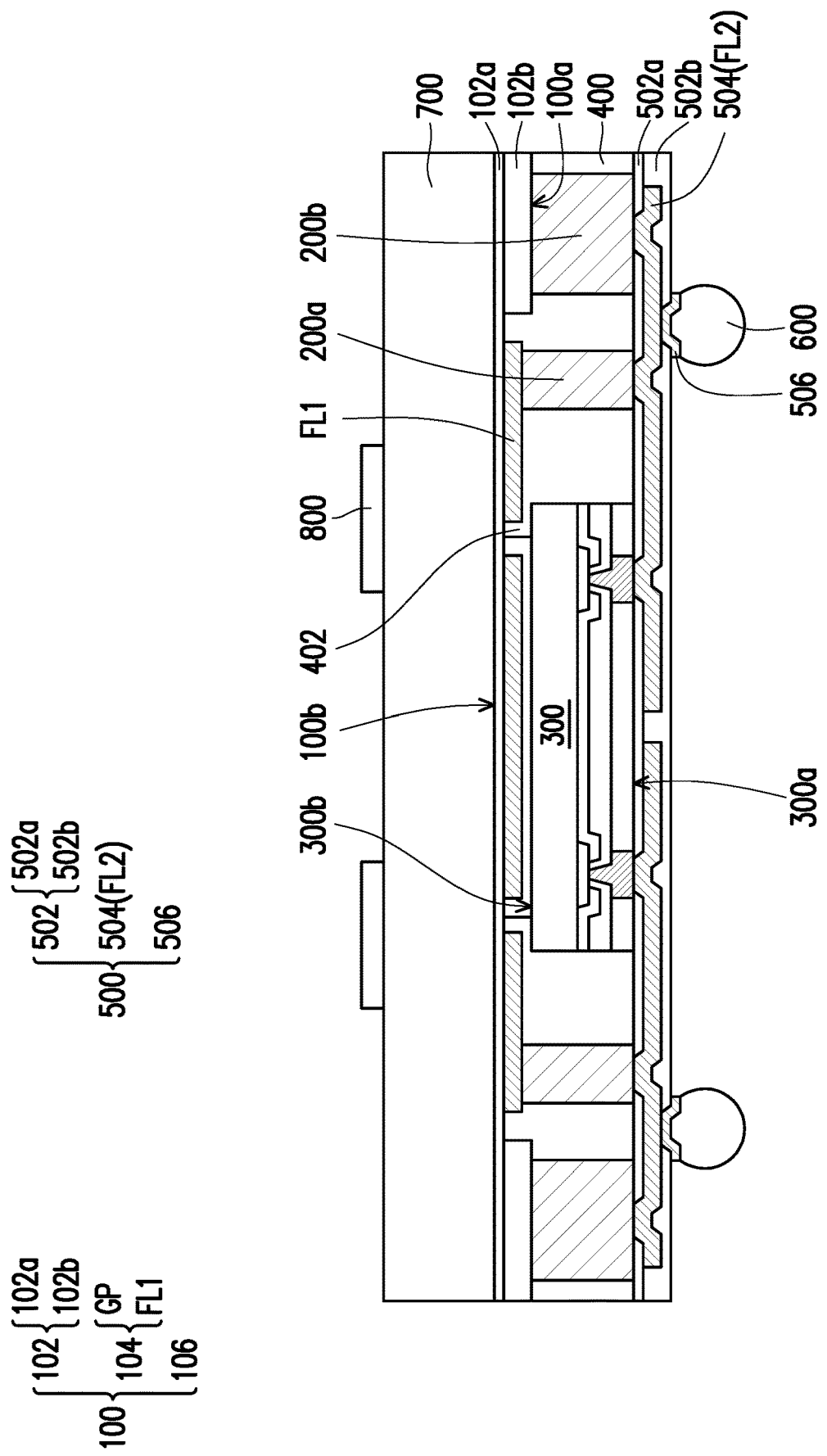
FIG. 4 is a schematic cross-sectional view illustrating an integrated fan-out package according to some alternative embodiments of the present disclosure.

FIG. 4 is a schematic cross-sectional view illustrating an integrated fan-out package 30 according to some alternative embodiments of the present disclosure. The integrated fan-out package 30 of FIG. 4 may be manufactured by the steps similar to the steps illustrated in FIG. 2A to FIG. 2J, so similar elements are denoted by the same reference numeral and the detailed descriptions thereof are omitted herein. As illustrated in FIG. 4, the integrated fan-out package 30 further includes a plurality of second TIVs 200b embedded in the insulation encapsulation 400. Moreover, in some embodiments, the step of filling the signal enhancement layer 106 into the trenches T of the dielectric layer 102b as illustrated in FIG. 2B may be omitted. As such, during the step of forming the insulation encapsulation 400 (the step illustrated in FIG. 2D), the insulation encapsulation 400 is filled into the trenches T of the dielectric layer 102b to constitute the protrusions 402 of the insulation encapsulation 400, as illustrated in FIG. 4. In other words, the protrusions 402 of the insulation encapsulation 400 laterally wrap around the first feed lines FL1 and cover at least part of the rear surface 300b of the die 300. In some embodiments, the insulation encapsulation 400 has a lower dissipation factor (Df) and/or a lower permittivity (Dk) than the first dielectric layer 102. In other words, the insulation encapsulation 400 and the first dielectric layer 102 are formed of different materials. In some embodiments, the insulation encapsulation 400 has the Df ranges between 0.001 and 0.02 and the Dk ranges between 3 and 4. Since the first feed lines FL1 are wrapped around by the insulation encapsulation 400, due to the low dissipation factor and/or the low permittivity nature of the insulation encapsulation 400, the signal loss/decay when transmitting through the first feed lines FL1 may be effectively reduced. As a result, the signal originated from the die 300 may be coupled to the conductive patches 800 with minimum loss, thereby effectively enhancing the efficiency of the integrated fan-out package 30.

Figure 5A:
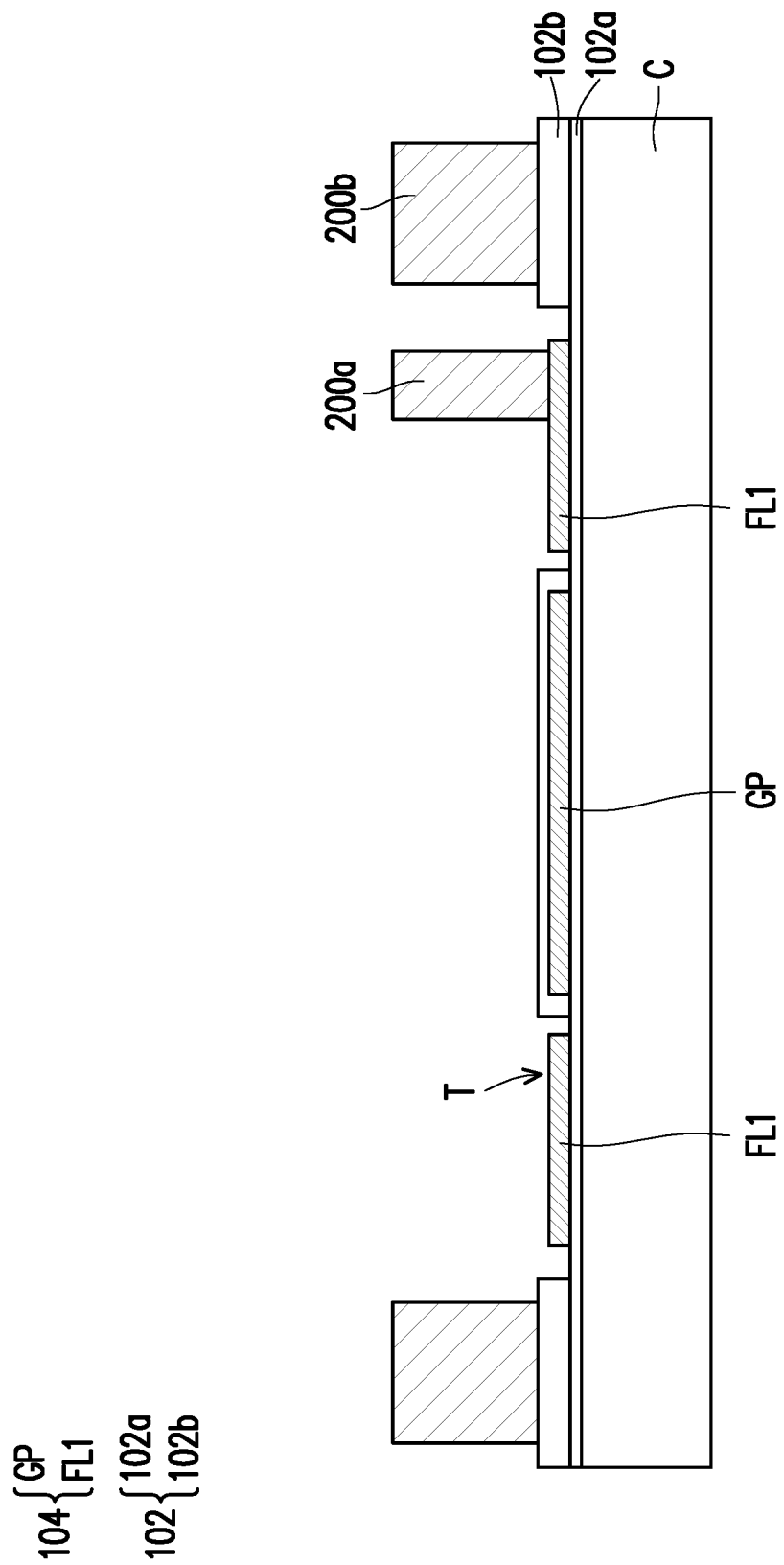
FIG. 5A to FIG. 5J are schematic cross-sectional views illustrating various stages in a manufacturing method of an integrated fan-out package according to some alternative embodiments of the present disclosure.
Figure 5B:
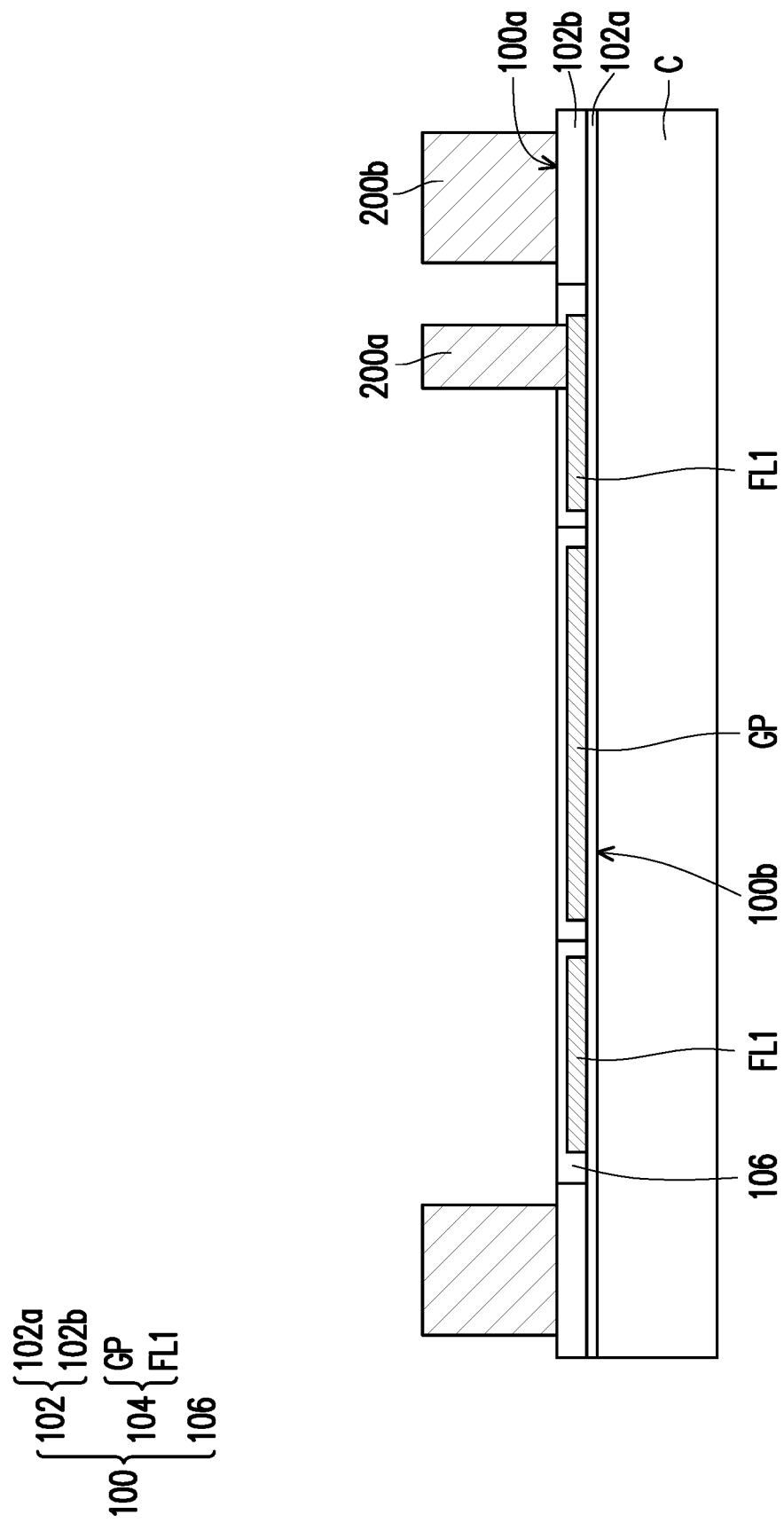
Figure 5C:
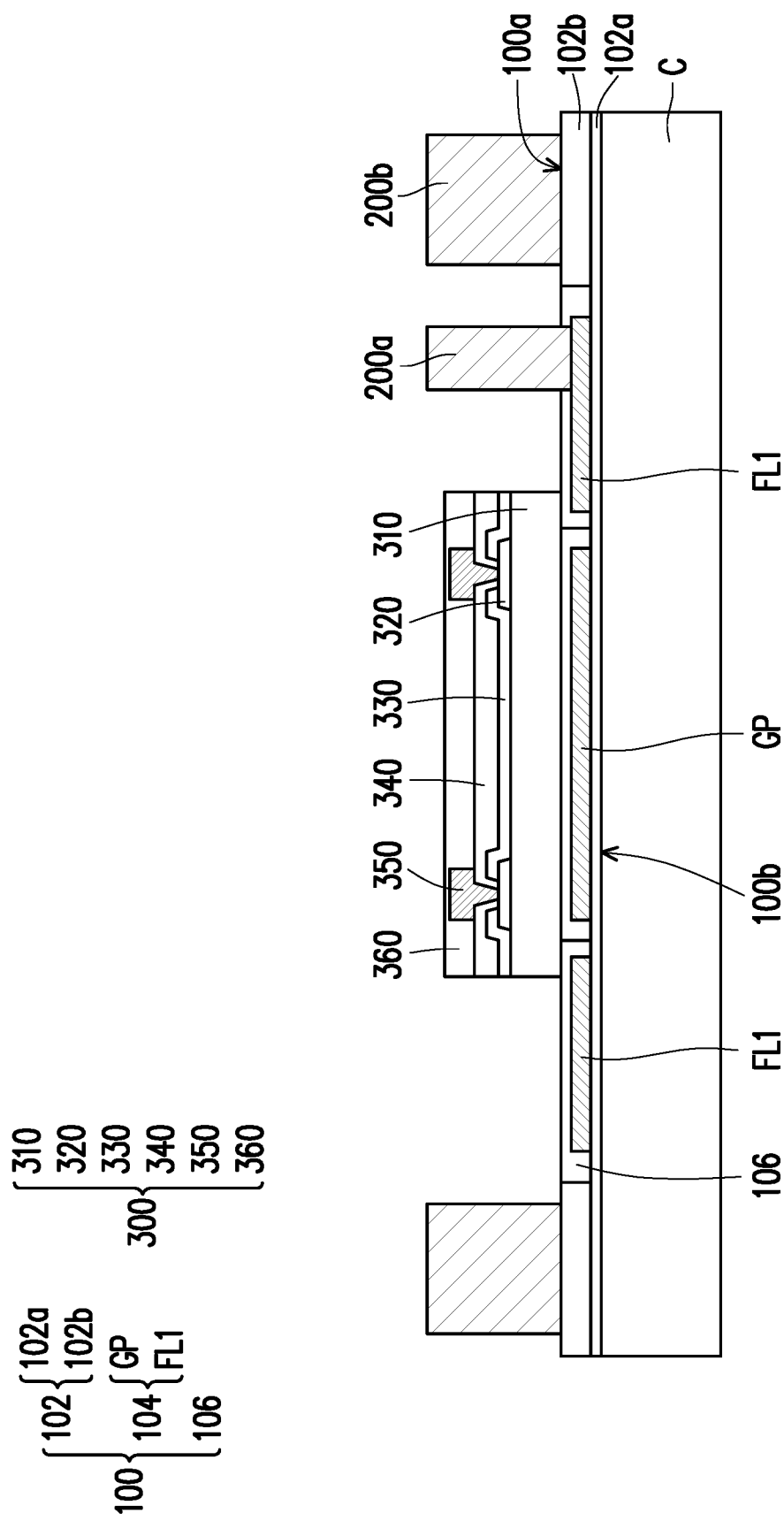
Figure 5D:
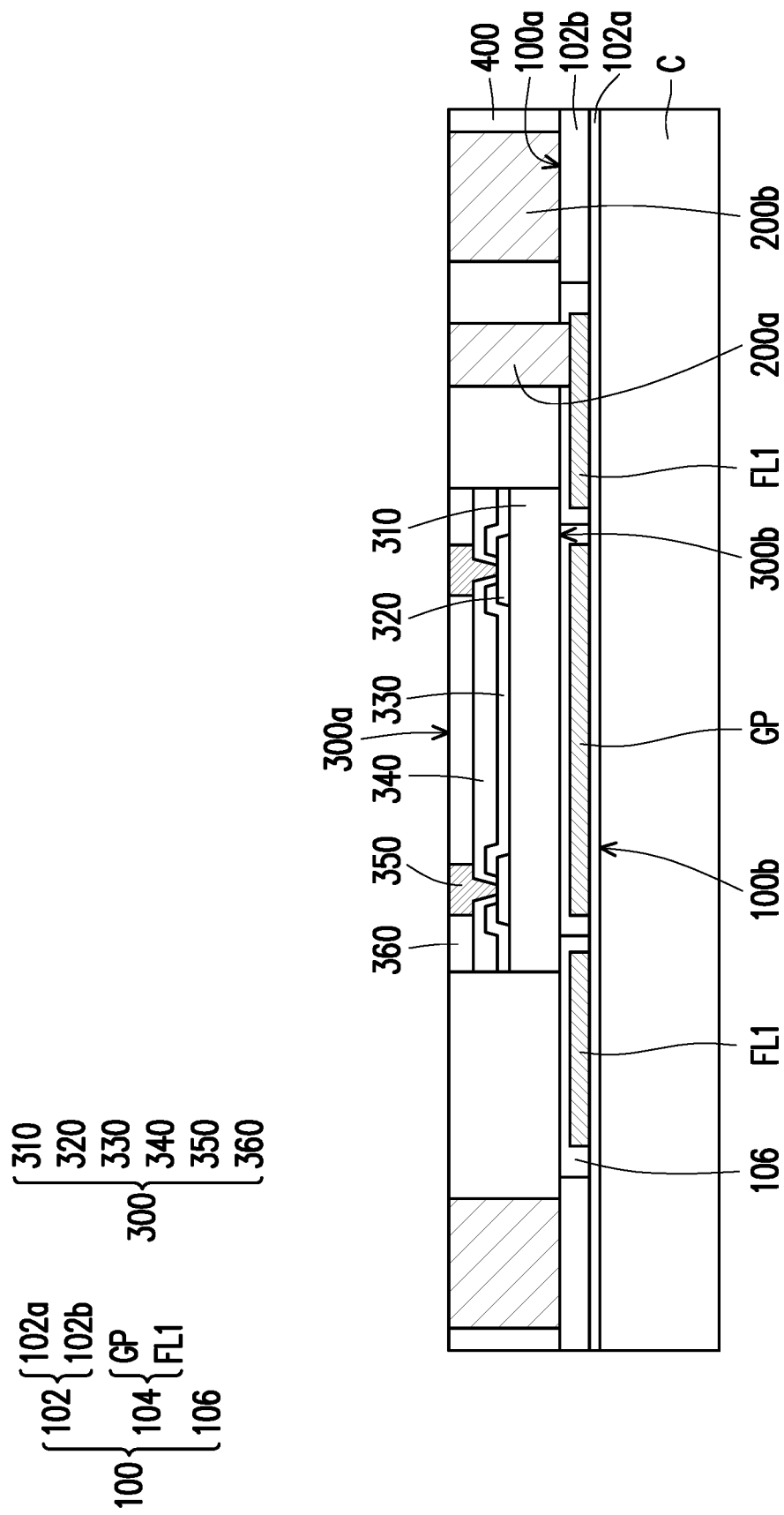

FIG. 5A to FIG. 5J are schematic cross-sectional views illustrating various stages in a manufacturing method of an integrated fan-out package 40 according to some alternative embodiments of the present disclosure. Throughout the descriptions with respect to FIG. 5A to FIG. 5J, elements similar to that of the previous embodiments are denoted by the same reference numeral and the detailed descriptions thereof are omitted herein. Referring to FIG. 5A to FIG. 5D, the steps illustrated herein are similar to the steps presented in FIG. 2A to FIG. 2D except for the formation of the second TIVs 200b. In some embodiments, the second TIVs 200b may be formed on the dielectric layer 102b during the step of forming the first TIV 200a, as illustrated in FIG. 5A. In some embodiments, the second TIVs 200b are arranged to form a plurality of dipole antennas.

Figure 5E:
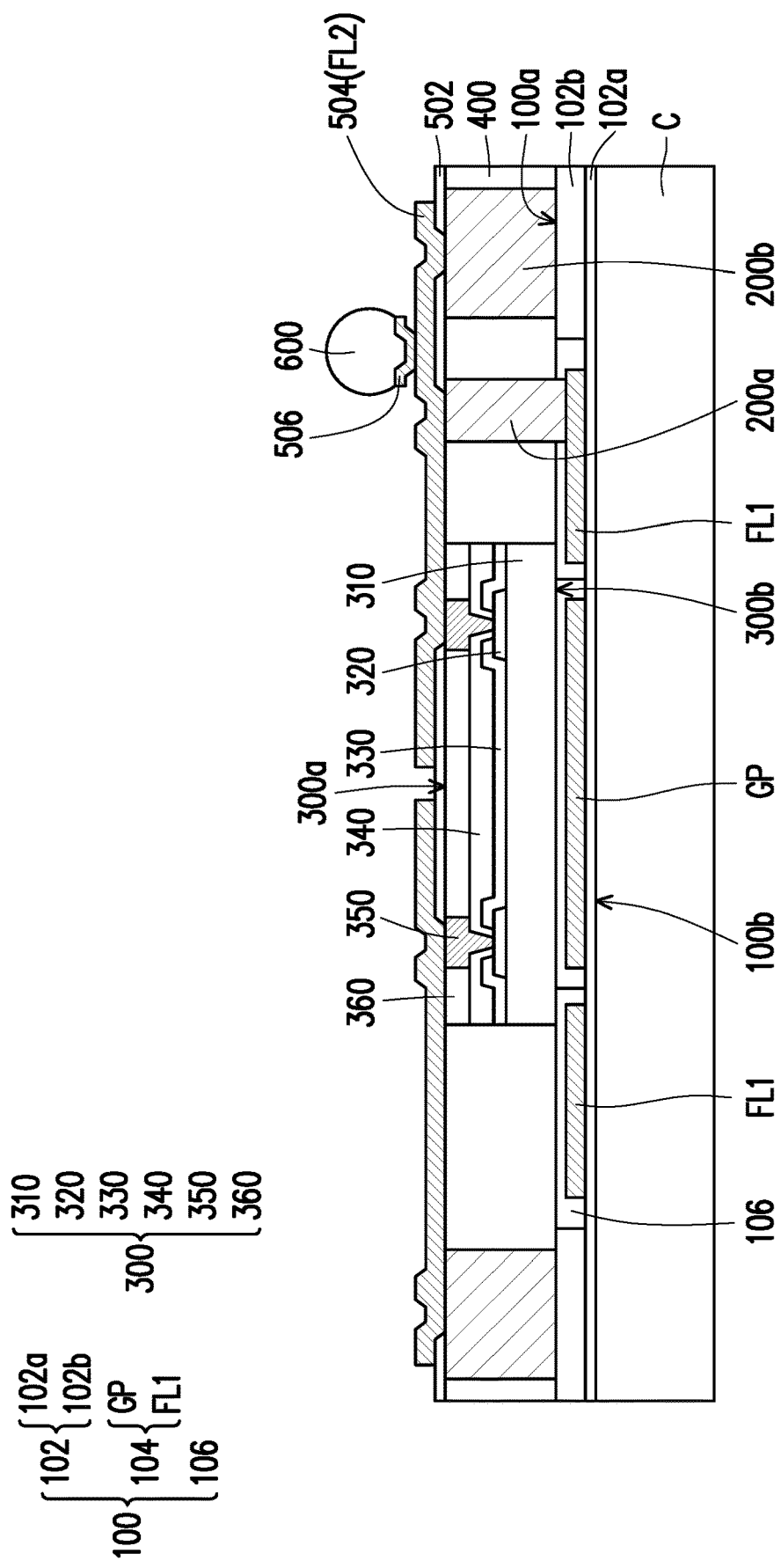

Referring to FIG. 5E, a second dielectric layer 502 is formed on the insulation encapsulation 400 and the active surface 300a of the die 300 to partially cover the insulation encapsulation 400, the first TIV 200a, and the second TIVs 200b. In some embodiments, the insulation encapsulation 400 has a lower dissipation factor (Df) and/or a lower permittivity (Dk) than the second dielectric layer 502. For example, the insulation encapsulation 400 has the Df ranges between 0.001 and 0.02 and the Dk ranges between 3 and 4. Thereafter, a second conductive pattern layer 504 and an under-ball metallurgy (UBM) layer 506 are sequentially formed on the first TIV 200a, the second TIVs 200b, the die 300, and the insulation encapsulation 400. In some embodiments, at least a portion of the second conductive pattern layer 504 is directly in contact with the insulation encapsulation, the first TIV 200a, and the second TIVs 200b. On the other hand, the second dielectric layer 502 is sandwiched between another portion of the second conductive pattern layer 504 and the insulation encapsulation 400. In some embodiments, when the second conductive pattern layer 504 is adapted to transmit signal from the die 300 to the first feed lines FL1 through the first TIVs 200a and/or when the second conductive pattern layer 504 is adapted to transmit signal from the die 300 to the second TIVs 200b, the second conductive pattern layer 504 may be referred to as a second feed line FL2. As illustrated in FIG. 5E, a plurality of conductive terminals 600 are attached to the UBM layer 506.

Figure 5F:
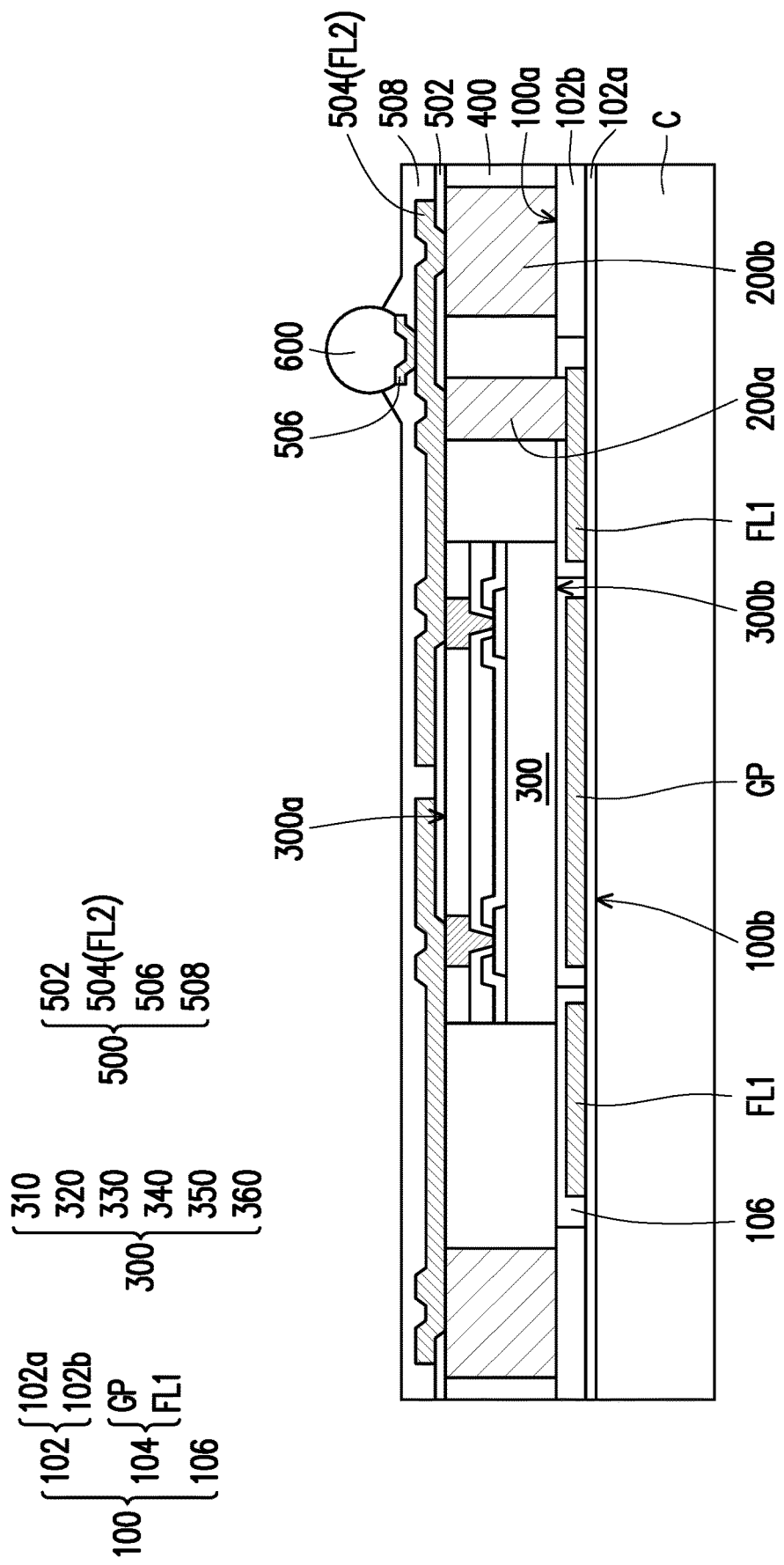
Figure 5G:
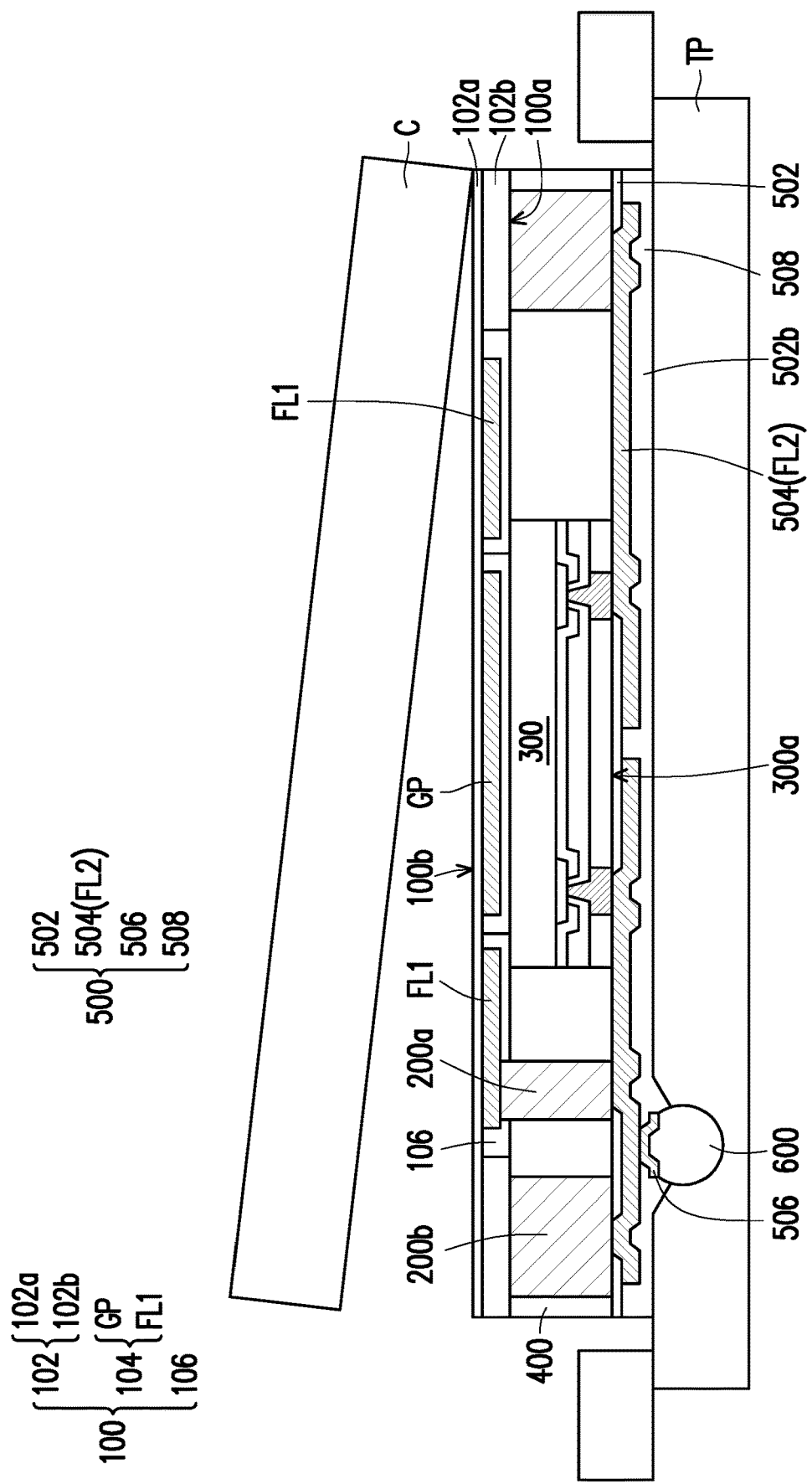
Figure 5H:
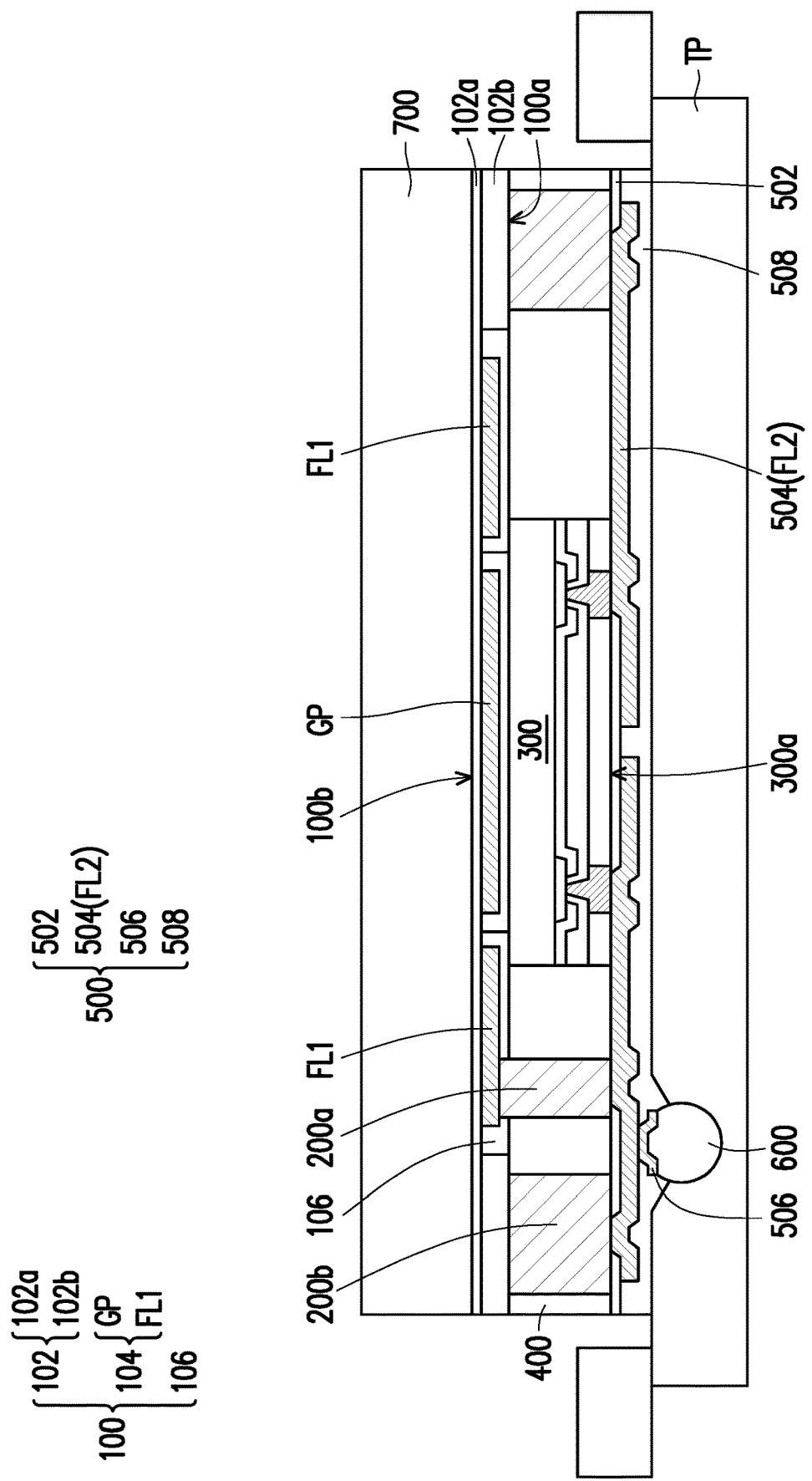
Figure 5I:
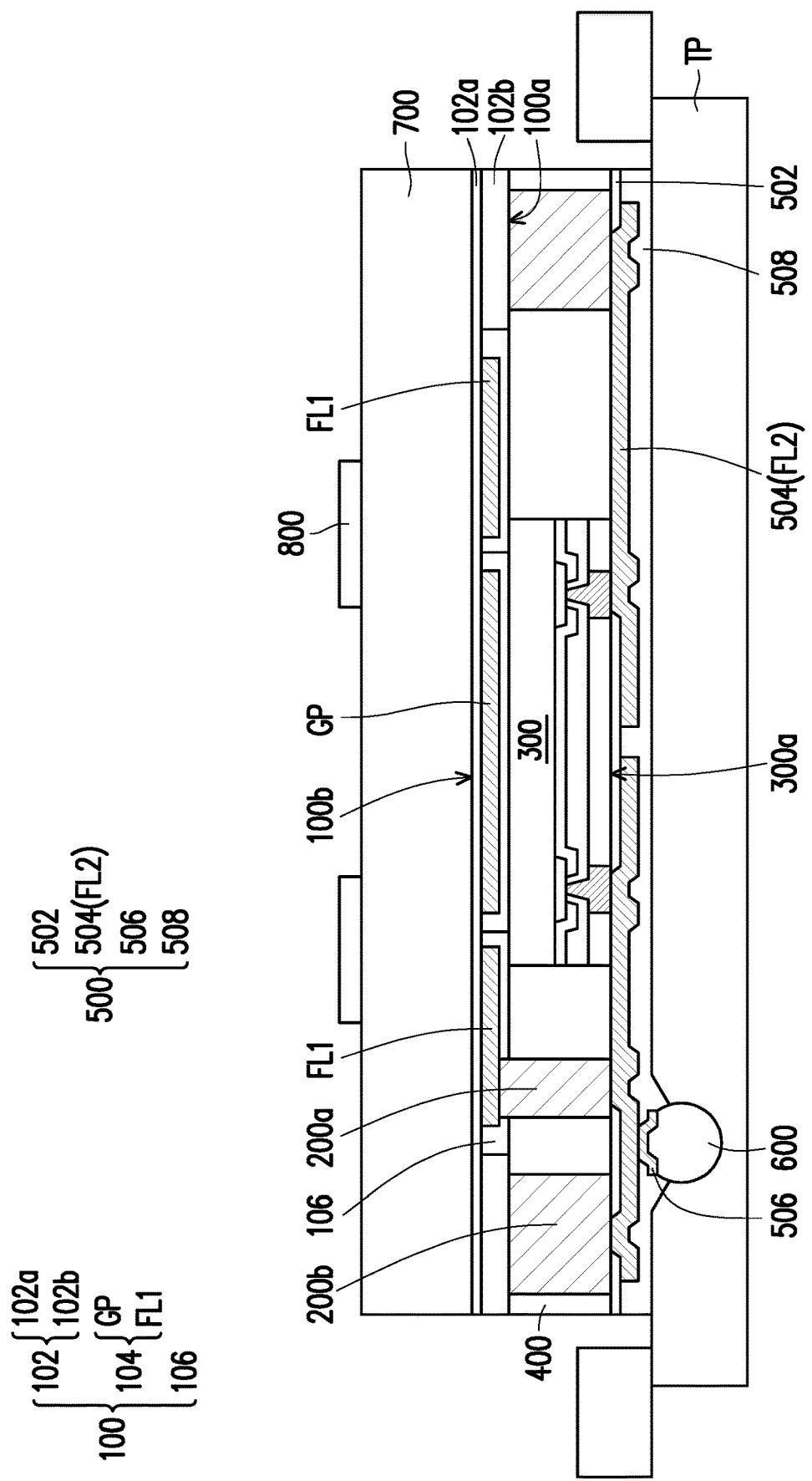

Referring to FIG. 5F, a signal enhancement layer 508 is formed to cover the second conductive pattern layer 504. In some embodiments, the signal enhancement layer 508 has a lower dissipation factor (Df) and/or a lower permittivity (Dk) than the second dielectric layer 502. In other words, the signal enhancement layer 508 and the first dielectric layer 502 are formed of different materials. In some embodiments, the signal enhancement layer 508 may be formed by the same material as that of the signal enhancement layer 106. For example, the signal enhancement layer 508 has the Df ranges between 0.001 and 0.02 and the Dk ranges between 3 and 4. In some embodiments, the second dielectric layer 502, the second conductive pattern layer 504, the UBM layer 506, and the signal enhancement layer 508 may be collectively referred to as a second redistribution structure 500. It should be noted that in some embodiments, the signal enhancement layer 106 may be referred to as a first signal enhancement layer while the signal enhancement layer 506 may be referred to as a second signal enhancement layer.

Figure 5J:
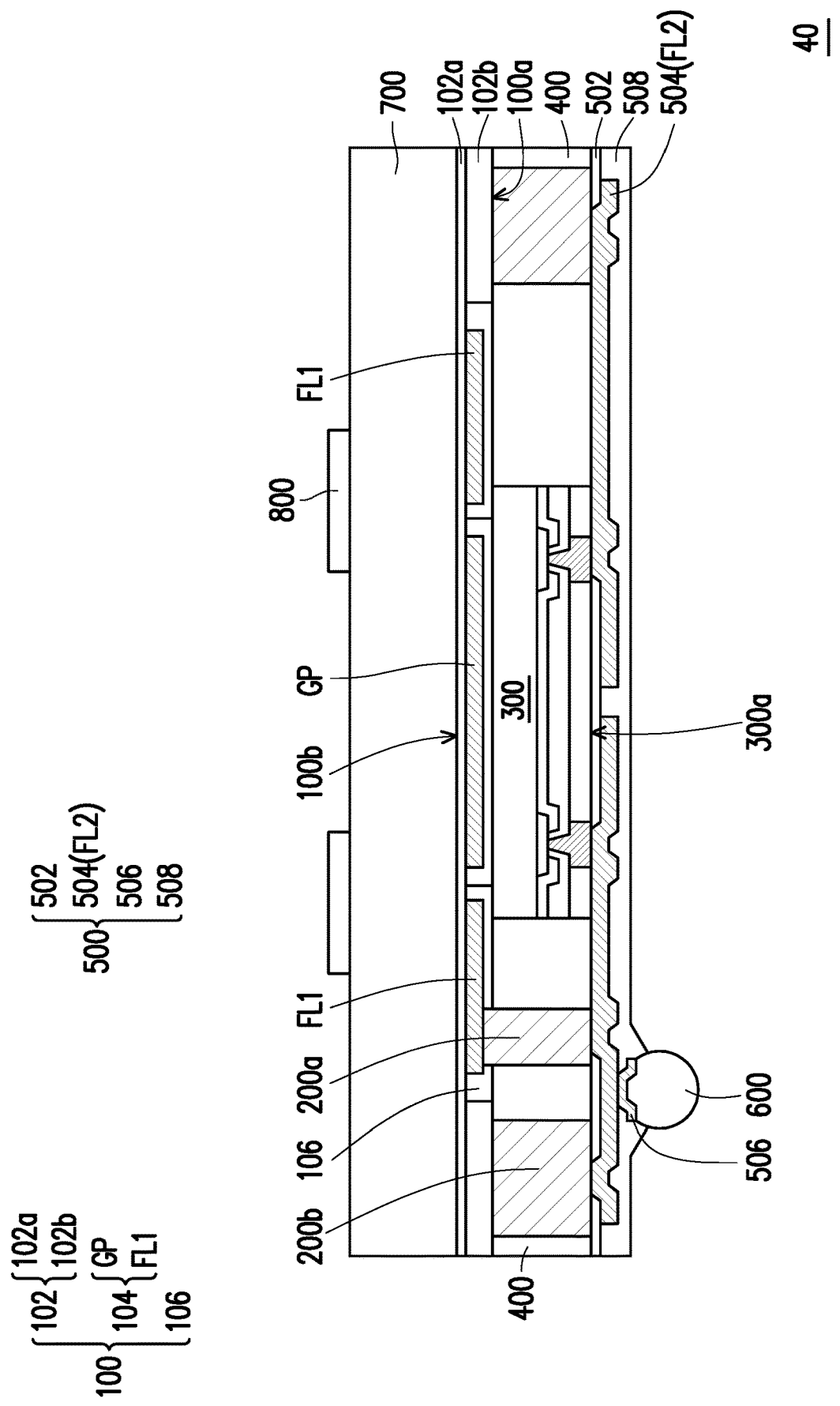

Referring to FIG. 5G to FIG. 5J, the steps illustrated herein are similar to the steps presented in FIG. 2G to FIG. 2J, so the detailed descriptions thereof are omitted herein. As illustrated in FIG. 5J, since the first feed lines FL1 are wrapped around by the signal enhancement layer 106 and the second feed lines FL2 are wrapped around by the insulation encapsulation 400 and the signal enhancement layer 508, due to the low loss dissipation factor and/or the low permittivity nature of the signal enhancement layer 106, the insulation encapsulation 400, and the signal enhancement layer 508, the signal loss/decay when transmitting through the first feed lines FL1 and the second feed lines FL2 may be effectively reduced. As a result, the signal originated from the die 300 may be coupled to the conductive patches 800 and/or transmitted to the second TIVs 200b with minimum loss, thereby effectively enhancing the efficiency of the integrated fan-out package 40.

In accordance with some embodiments of the disclosure, an integrated fan-out package includes a first redistribution structure, a die, an insulation encapsulation, and a second redistribution structure. The die is disposed on the first redistribution structure. The insulation encapsulation encapsulates the die. The second redistribution structure is disposed on the die and the insulation encapsulation. At least one of the first redistribution structure and the second redistribution structure includes a dielectric layer, a feed line, and a signal enhancement layer. The feed line is at least partially disposed on the dielectric layer. The signal enhancement layer covers the feed line. The signal enhancement layer has a lower dissipation factor (Df) and/or a lower permittivity (Dk) than the dielectric layer.

In accordance with some alternative embodiments of the disclosure, an integrated fan-out package includes a first redistribution structure, a die, an insulation encapsulation, and a second redistribution structure. The first redistribution structure includes a first dielectric layer, a first feed line, and a first signal enhancement layer. The first feed line is disposed on the first dielectric layer. The first signal enhancement layer covers the first feed line. The die is disposed on the first redistribution structure. The insulation encapsulation encapsulates the die. The second redistribution structure is disposed on the die and the insulation encapsulation. The second redistribution structure includes a second feed line, a second dielectric layer, and a second signal enhancement layer. The second feed line is disposed on the insulation encapsulation and the die. The second dielectric layer is sandwiched between a portion of the second feed line and the insulation encapsulation. The second signal enhancement layer covers the second feed line. The first signal enhancement layer and the second signal enhancement layer have a lower dissipation factor (Df) and/or a lower permittivity (Dk) than the first dielectric layer and the second dielectric layer.

In accordance with some alternative embodiments of the disclosure, an integrated fan-out package includes a first redistribution structure, a die, an insulation encapsulation, and a second redistribution structure. The first redistribution structure includes a dielectric layer and a feed line. The feed line is disposed on the dielectric layer. The die is disposed on the first redistribution structure. The insulation encapsulation encapsulates the die and includes a protrusion laterally wraps around the feed line. The insulation encapsulation has a lower dissipation factor (Df) and/or a lower permittivity (Dk) than the dielectric layer. The second redistribution structure is disposed on the die and the insulation encapsulation.

In accordance with some alternative embodiments of the disclosure, an integrated fan-out package includes a first redistribution structure, a die, an insulation encapsulation, and a second redistribution structure. The first redistribution structure includes a first dielectric layer, a ground plane, a second dielectric layer, and a first feed line. The ground plane is disposed on the first dielectric layer. The second dielectric layer is disposed on the first dielectric layer. The second dielectric layer covers the ground plane. The second dielectric layer has a plurality of trenches. The first feed line is disposed on the first dielectric layer and is located in the trenches. The die is disposed on the first redistribution structure. The insulation encapsulation encapsulates the die. The insulation encapsulation fills into the trenches to cover the first feed line and sidewalls of the trenches. The insulation encapsulation has a lower dissipation factor (Df) and/or a lower permittivity (Dk) than the first dielectric layer. The second redistribution structure is disposed on the die and the insulation encapsulation.

In accordance with some embodiments of the disclosure, a manufacturing method of an integrated fan-out package includes at least the following steps. A first redistribution structure is formed. The first redistribution structure is formed by at least the following steps. A first dielectric layer is formed and a first feed line is formed on the first dielectric layer. A die is placed on the first redistribution structure. The die has an active surface and a rear surface opposite to the active surface. The rear surface of the die is attached to the first redistribution structure. A first signal enhancement layer covering the first feed line is formed. The first signal enhancement layer has a lower dissipation factor (Df) and/or a lower permittivity (Dk) than the first dielectric layer. An insulation encapsulation is formed on the first redistribution structure to encapsulate the die. A second redistribution structure is formed on the die and the insulation encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
    a first redistribution structure, comprising:
        a dielectric layer; and
        a feed line disposed on the dielectric layer;
    a die, disposed on the first redistribution structure;
    an insulation encapsulation encapsulating the die, wherein the insulation encapsulation has a protrusion laterally wraps around the feed line, and the insulation encapsulation has a lower dissipation factor (DO and/or a lower permittivity (Dk) than the dielectric layer; and
    a second redistribution structure, disposed on the die and the insulation encapsulation.

2. The integrated fan-out package according to claim 1, wherein the insulation encapsulation has the Df ranges between 0.001 and 0.02 and the Dk ranges between 3 and 4.

3. The integrated fan-out package according to claim 1, further comprising a plurality of first through interlayer vias (TIV) and a plurality of second TIVs embedded in the insulation encapsulation, the plurality of first TIVs electrically connect the first redistribution structure and the second redistribution structure, and the plurality of second TIVs are electrically connected to the second redistribution structure.

4. The integrated fan-out package according to claim 1, further comprising:
    a plurality of conductive terminals disposed on the second redistribution structure;
    an insulating layer disposed on the first redistribution structure opposite to the die; and
    a plurality of conductive patches disposed over the insulating layer.

5. The integrated fan-out package according to claim 1, wherein the die has an active surface facing the second redistribution and a rear surface opposite to the active surface, and the protrusion of the insulation encapsulation covers at least part of the rear surface of the die.

6. The integrated fan-out package according to claim 5, wherein the rear surface of the die is coplanar with the first redistribution structure.

7. The integrated fan-out package according to claim 5, wherein the feed line extends over the rear surface of the die.

8. An integrated fan-out package, comprising:
    a first redistribution structure, comprising:
        a first dielectric layer;
        a ground plane disposed on the first dielectric layer;
        a second dielectric layer disposed on the first dielectric layer, wherein the second dielectric layer covers the ground plane, and the second dielectric layer has a plurality of trenches; and
        a first feed line disposed on the first dielectric layer and located in the plurality of trenches;
    a die, disposed on the first redistribution structure;
    an insulation encapsulation encapsulating the die, wherein the insulation encapsulation fills into the plurality of trenches to cover the first feed line and sidewalls of the plurality of trenches, and the insulation encapsulation has a lower dissipation factor (Df) and/or a lower permittivity (Dk) than the first dielectric layer; and
    a second redistribution structure disposed on the die and the insulation encapsulation.

9. The integrated fan-out package according to claim 8, wherein the second redistribution structure comprises:
- a second feed line, disposed on the insulation encapsulation and the die; and
- a third dielectric layer, sandwiched between a portion of the second feed line and the insulation encapsulation.

10. The integrated fan-out package according to claim 8, wherein the insulation encapsulation has the Df ranging between 0.001 and 0.02.

11. The integrated fan-out package according to claim 8, wherein the insulation encapsulation has the Dk ranging between 3 and 4.

12. The integrated fan-out package according to claim 8, wherein the die has an active surface facing the second redistribution and a rear surface opposite to the active surface, and the insulation encapsulation covers at least part of the rear surface of the die.

13. The integrated fan-out package according to claim 8, further comprising a plurality of first through interlayer vias (TIV) and a plurality of second TIVs embedded in the insulation encapsulation, the plurality of first TIVs electrically connect the first redistribution structure and the second redistribution structure, and the plurality of second TIVs are electrically connected to the second redistribution structure.

14. A manufacturing method of an integrated fan-out package, comprising:
- forming a first redistribution structure, comprising:
  - forming a first dielectric layer; and
  - forming a first feed line on the first dielectric layer;
- placing a die on the first redistribution structure, wherein the die has an active surface and a rear surface opposite to the active surface, and the rear surface of the die is attached to the first redistribution structure;
- forming an insulation encapsulation on the first redistribution structure to encapsulate the die, wherein the insulation encapsulation has a protrusion laterally wraps around the feed line, and the insulation encapsulation has a lower dissipation factor (DO and/or a lower permittivity (Dk) than the dielectric layer; and
- forming a second redistribution structure on the die and the insulation encapsulation.

15. The method according to claim 14, wherein the signal enhancement layer has the Df ranging between 0.001 and 0.02 and the Dk ranging between 3 and 4.

16. The method according to claim 14, wherein the step of forming the second redistribution structure comprises:
- forming a second dielectric layer on the die and the insulation encapsulation; and
- forming a second feed line on the second dielectric layer.

17. The method according to claim 14, further comprising:
- forming a plurality of first through interlayer vais (TIV) and a plurality of second TIVs on the first redistribution structure, wherein the plurality of first TIVs electrically connect the first redistribution structure and the second redistribution structure, and the plurality of second TIVs are electrically connected to the second redistribution structure.

18. The method according to claim 14, further comprising:
- forming an insulating layer on the first redistribution structure opposite to the die; and
- forming a plurality of conductive patches over the insulating layer.

19. The method according to claim 14, wherein the protrusion of the insulation encapsulation is formed to cover at least part of the rear surface of the die.

20. The method according to claim 14, further comprising:
- forming a plurality of conductive terminals on the second redistribution structure;
- forming an insulating layer on the first redistribution structure opposite to the die; and
- forming a plurality of conductive patches over the insulating layer.

* * * * *